US010872654B1

(12) United States Patent
Lee

(10) Patent No.: US 10,872,654 B1
(45) Date of Patent: Dec. 22, 2020

(54) SUB-WORD LINE DRIVER WITH SOFT-LANDING

(71) Applicant: Micron Technology, Inc., Boise, ID (US)

(72) Inventor: Kyuseok Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/688,002

(22) Filed: Nov. 19, 2019

(51) Int. Cl.
*G11C 8/02* (2006.01)
*G11C 11/408* (2006.01)
*G11C 11/409* (2006.01)
*G11C 7/22* (2006.01)
*G11C 11/4078* (2006.01)
*G11C 11/4074* (2006.01)

(52) U.S. Cl.
CPC .......... *G11C 11/4085* (2013.01); *G11C 7/222* (2013.01); *G11C 11/409* (2013.01); *G11C 11/4074* (2013.01); *G11C 11/4078* (2013.01)

(58) Field of Classification Search
CPC . G11C 11/4097; G11C 11/4085; G11C 5/025; G11C 11/406; G11C 29/808; G11C 29/848; G11C 5/063; G11C 7/1006; G11C 11/4091; G11C 7/06; G11C 5/02; G11C 7/1048; G11C 7/18; G11C 8/08; G11C 2207/104; G11C 7/1072; G11C 8/14; G11C 11/4074
USPC ..... 365/230.03, 230.06, 200, 203, 222, 191, 365/207, 208, 149, 189.02, 189.09, 365/189.11, 233.1, 185.2, 189.05, 194, 365/201, 205, 225.7, 226
See application file for complete search history.

(56) References Cited

U.S. PATENT DOCUMENTS

2002/0001217 A1\* 1/2002 Aritomi .................. G11C 8/10
365/63

OTHER PUBLICATIONS

Unpublished U.S. Appl. No. 16/399,159 by Charles L. Ingalls et al.; filed Apr. 30, 2019; titled "FX Driver Circuit"; 48 pages.

(Continued)

*Primary Examiner* — Thong Q Le
(74) *Attorney, Agent, or Firm* — Perkins Coie LLP

(57) ABSTRACT

A memory device includes a plurality of sub-word line drivers with, each sub-word line driver configured to receive a main word line signal and configured to drive a respective local word line to at least one of an active state, a soft-landing state, an off state based on the main word line signal and a phase signal. The memory device also includes a plurality of phase drivers with each phase driver configured to generate the respective phase signal. The memory device can further include a processing device configured to drive the respective local word line to the soft-landing state prior to entering the off state when transitioning from the active state to the off state so as to provide row hammer stress mitigation between adjacent local word lines corresponding to the plurality of sub-word line drivers. Each sub-word line driver includes a diode-connected transistor.

24 Claims, 11 Drawing Sheets

(56) References Cited

OTHER PUBLICATIONS

Unpublished U.S. Appl. No. 16/399,197 by Charles L. Ingalls et al.; filed Apr. 30, 2019; titled "Sub-Word Line Driver Circuit"; 49 pages.
Unpublished U.S. Appl. No. 16/399,235 by Tae H. Kim et al.; filed Apr. 30, 2019; titled "Main Word Line Driver Circuit"; 51 pages.
Unpublished U.S. Appl. No. 16/399,283 by Christopher J. Kawamura et al.; filed Apr. 30, 2019; titled "DRAM Array Architecture With Row Hammer Stress Mitigation"; 52 pages.

* cited by examiner

SUB-WORD LINE DRIVER WITH SOFT-LANDING

TECHNICAL FIELD

Embodiments of this invention relate to the architecture of a DRAM memory device and soft-landing methods for mitigating row hammer stress in the DRAM memory device.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

Memory devices employ a variety of signals within the various circuits of the memory device. Signal drivers for applying the signals to signal lines are in common use in electronic devices, such as integrated circuits. One such signal driver can be used to apply voltages to word lines in an array of memory cells. The word lines may extend through a memory cell array from a set of global word line drivers (also referred to herein as "main word line drivers" or "MWDs"). The global word line driver may selectively actuate each of the word lines responsive to the memory device receiving a row address corresponding to the word line. Each of the memory cells in the row corresponding to the received row address then applies stored data to a respective sense amplifier.

Some semiconductor memory devices, such as DRAM, store information as charge accumulated in cell capacitors ("cells"), with the cells organized into rows. In some cases, charge applied to cells in one row can interfere with charge in one or more adjacent "victim" rows or cells can otherwise lose their charge, an occurrence referred to as "leakage." Certain instances of leakage can occur when memory rows experience "row hammering," which is when a row is repeatedly driven to an active level in a short time (e.g., over a duration less than that between sequential refresh operations) and the activations affect one or more adjacent victim rows. This can result in changes to cell charges in the victim rows, putting the information stored there at risk.

Various memory systems use one or more strategies to address leakage, such as row hammer stress mitigation or target row refreshing (TRR). Row hammer stress mitigation can include a host or controller automatically performing refresh operations on victim rows on a random or periodic basis. In some embodiments, row hammer stress mitigation can include controlling the local word line voltage such that, when going from an active state to a pre-charge state, the local word line voltage is paused at an intermediate voltage level for a predetermined time period (referred to herein as a "soft-landing state"). By pausing at the intermediate voltage level, adjacent memory rows do not experience the effects of a rapid change in voltage levels and the row hammer stress can be mitigated.

Each of the word lines extending through the array may be relatively long and, as a result, may have substantial capacitance. Furthermore, the word lines may be fabricated of polysilicon, which may have a relatively high resistance. The combination of the relatively high capacitance and relatively high resistance of the word lines may make it difficult for the global word line driver to quickly switch signal levels on the word lines, particularly in portions of the memory cell array that are more distant from the global word line driver. To alleviate this problem, it is conventional for memory cell arrays to be divided into smaller memory cell arrays, and to fabricate local word line drivers (also referred to herein as "sub-word line drivers" and "SWDs") between at least some of these smaller memory cell arrays. However, in related art memory devices, the layout areas of the SWDs and the corresponding MWDs can be further optimized. In addition, the metal (BEOL) connections in related art SWDs can be complex due to the number of control pins that are required. Further, the voltage level for the soft-landing state in related art SWDs and/or MWDs is not adjustable and thus the row hammer mitigation may not be optimized.

DETAILED DESCRIPTION

As discussed in greater detail below, the technology disclosed herein relates to signal drivers for word line drivers and associated circuits in memory systems and devices. A person skilled in the art, however, will understand that the technology may have additional embodiments and that the technology may be practiced without several of the details of the embodiments described below with reference to FIGS. 1-8. In the illustrated embodiments below, the memory devices and systems are primarily described in the context of devices incorporating DRAM storage media. Memory devices configured in accordance with other embodiments of the present technology, however, can include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

Figure 1:
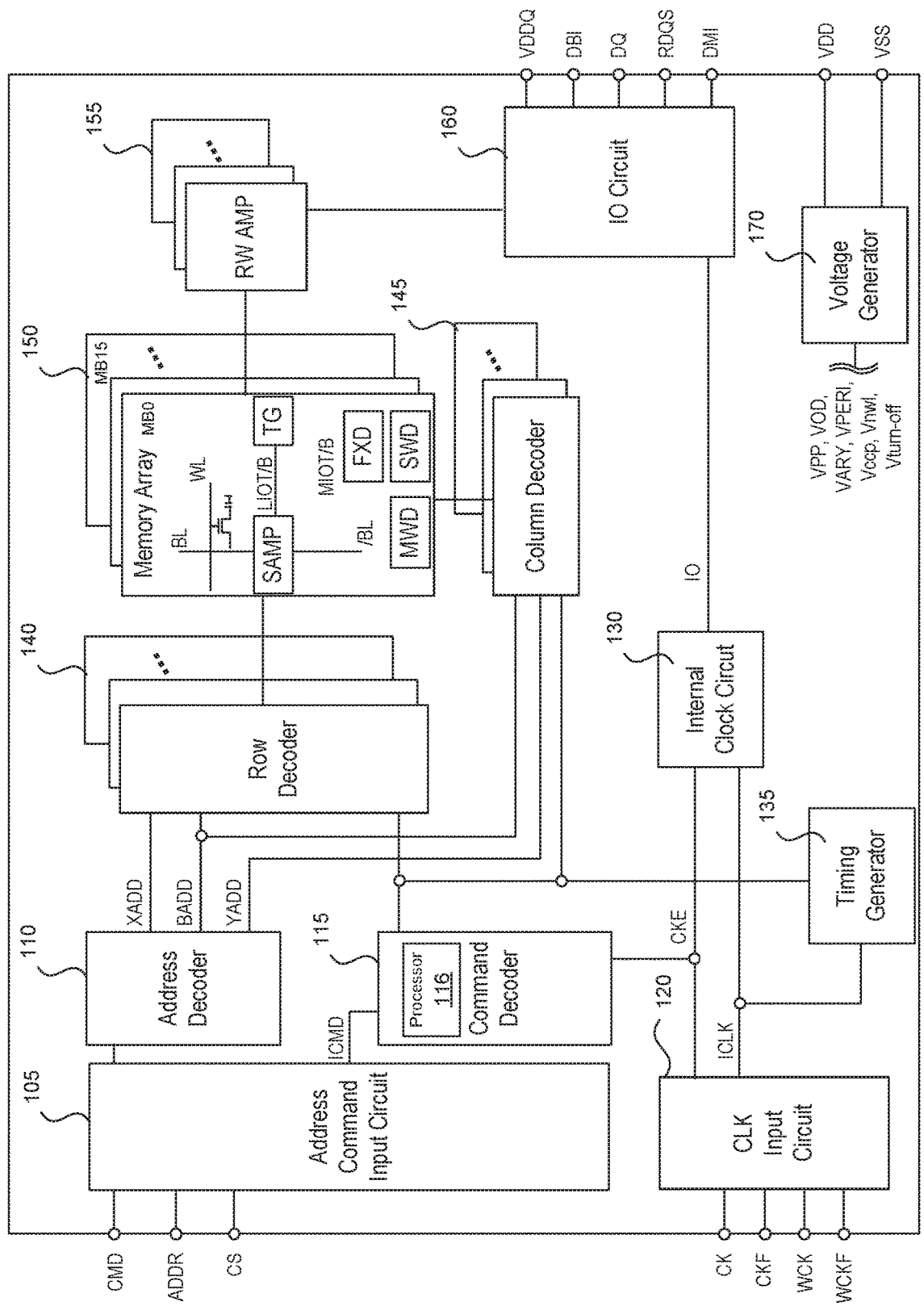
FIG. 1 is block diagram of an embodiment of a memory system in accordance with the present disclosure.

FIG. 1 is a block diagram schematically illustrating a memory device 100 in accordance with an embodiment of the present technology. The memory device 100 may include an array of memory cells, such as memory array 150. The memory array 150 may include one or more banks MB (e.g., banks MB0 to MB15 in the example of FIG. 1), and each bank may include a plurality of word lines (WL), one or more bit lines (BL), and one or more memory cells arranged at intersections of the word lines and the bit lines. The selection of a word line WL and the signal voltage on the word line WL can be performed by a row decoder 140 in combination with the corresponding MWDs, SWDs, and FX phase drivers ("FX drivers," "phase drivers," or "FXDRVs"). The MWDs, SWDs, and FXDRVs are discussed in further detail below. The selection of a bit line BL can be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals to communicate with an external memory controller and/or host processor (not shown). The external terminals can include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, VSSQ, etc.

The command terminals and address terminals may be supplied with an address signal and a bank address signal from an external memory controller and/or host processor. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD can be provided as internal command signals ICMD to a command decoder 115 via the command/address input circuit 105. The command decoder 115 can include a processor 116 and/or other circuits to decode the internal command signals ICMD to generate various internal signals and commands for performing memory operations. For example, the processor 116 can execute the instructions to and/or other circuits can be configured to generate row and column command signals and/or the associated timing signals (e.g., in coordination with the timing generator 135) to select a word line and/or a bit line to perform the desired memory operation. Of course, the processor/circuitry to generate the command and/or timing signals can be located in another component of the memory device 100 such as, for example, address command input circuit 105 and/or an external controller/processor. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160 and supplied via the input/output circuit 160 and the read/write amplifiers 155 to the memory array 150. The write data may be written in the memory cell designated by the row address and the column address. The write data may be provided to the data terminals at a time that is defined by write latency WL information. Operation of the I/O circuit 160 is known to those skilled in the art and thus, for brevity, will not be discussed The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, Vcc, Vccp, Vccp2, Vnw1, Vturn-off, and the like based on, for example, the power supply potentials VDD and VSS and/or other power supply potentials. The internal potential VPP can be used in the row decoder 140, the internal potentials VOD and VARY can be used in the sense amplifiers included in the memory array 150, and the internal potential VPERI can be used in many other circuit blocks.

Clock input circuit 120 can receive external clock signal and generate various internal clock signals. For example, the clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (TO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

Figure 2:
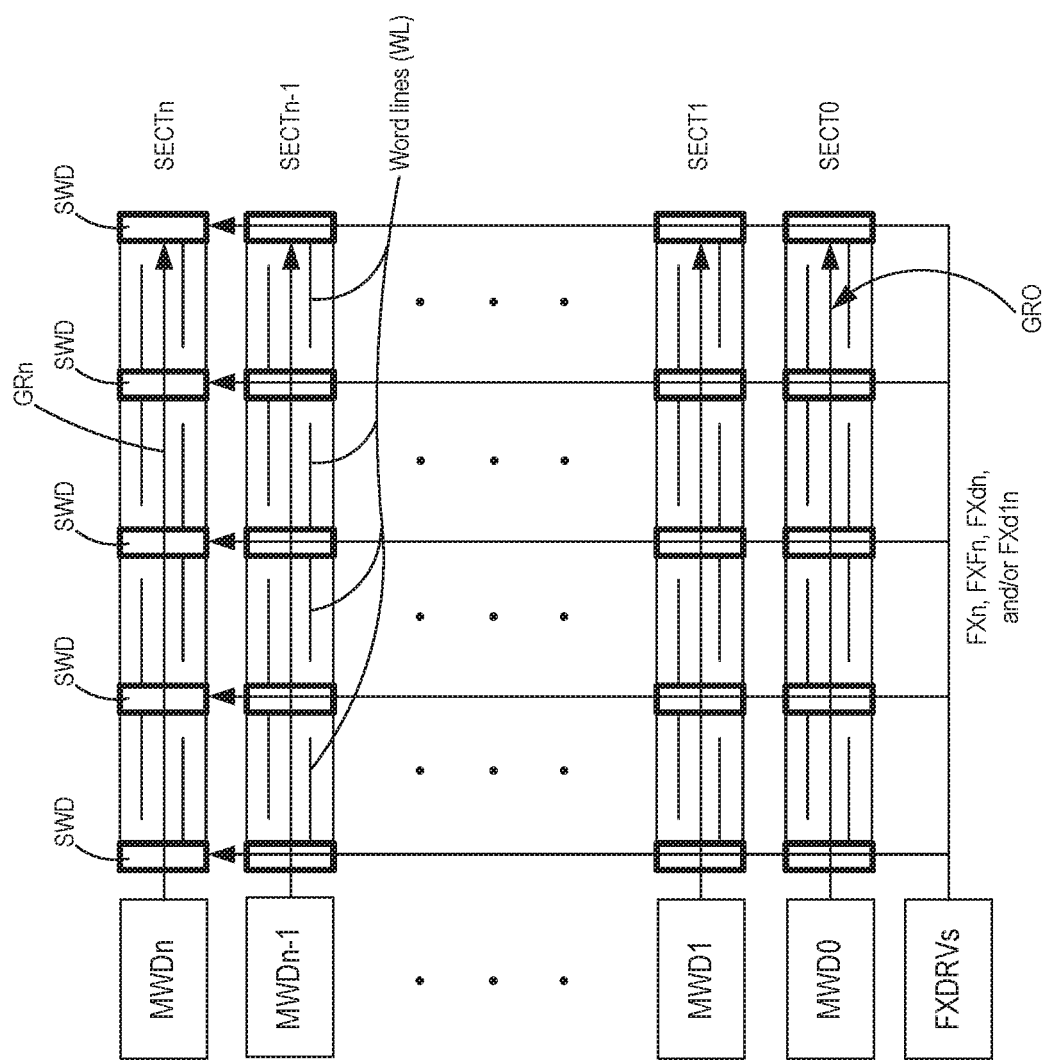
FIG. 2 is a block diagram of a portion of a memory bank array that can be used in the memory system of FIG. 1.

FIG. 2 illustrates a simplified block diagram of an exemplary structure of a memory bank MB of the memory array 150. As shown in FIG. 2, each memory bank MB can include one or more memory array sections SECT (e.g., SECT0 to SECTn) having a group of memory cells. Each memory array section SECT includes an MWD (e.g., MWD0 to MWDn) which outputs the appropriate signal voltage on the corresponding main word line (also referred to herein as "global word line") GR (e.g., GR0 to GRn). Depending on the configuration of the MWD and corresponding circuits, a high signal level or a low signal level can correspond to an active state on the global word line GR. For example, in some exemplary embodiments of the present technology, when in an active state, the MWD can output a voltage level on the global word line GR that is Vss (e.g., ground or 0 volts) or some other low voltage level corresponding to a the MWD being in an active state. When the global word line GR is not in an active state, the MWD can output a voltage level on the global word line GR that is at Vccp (e.g., in a range from about 3.0 volts to 3.5 volts such as, for example, 3.2 volts) or some other voltage level corresponding to a non-active state (e.g., Vcc, which can be in a range from about 2.3 volts to 2.7 volts such as, for example, 2.5 volts). While the global word line GR can be directly coupled to the memory cells in the memory bank MB, the global word line GR extending through the memory bank MB can have substantial capacitance and resistance, as discussed above. The capacitance and resistance can reduce the speed at which each MWD drives the respective global word line GR. To mitigate this problem, each global word line GR can be coupled to one or more SWDs. For example, in some embodiments, each global word line can connect to eight SWDs, sixteen SWDs, or some other desired number of SWDs. The SWDs can be fabricated between at least some of the memory cell arrays in memory bank MB. Each SWD outputs the appropriate signal voltage on the corresponding local word line WL (e.g., WL0 to WLn). Depending on the configuration of the SWD and corresponding circuits, a high signal level or a low signal level can correspond to the active state on the word line WL. For example, in some exemplary embodiments of the present technology, when in an active state, the SWD can output a high voltage level on the local word line WL that is at a voltage Vact. In some embodiments, the Vact voltage level can be in a range from about 3.0 volts to 3.5 volts such as, for example, 3.2 volts, or some other high voltage level corresponding to an active state (e.g., in other embodiments, Vact can correspond to Vcc, which can be in a range from about 2.3 volts to 2.7 volts such as, for example, 2.5 volts). When in a pre-charge state or an idle state, the SWD can output a low voltage level on the local word line WL that is at a voltage Voff. In some embodiments, the Voff voltage level can be in a range from about –0.1 volt to –0.3 volt such as, e.g., –0.2 volts or some other low voltage level corresponding to a pre-charge or idle state. When row hammer stress mitigation is enabled, during the transition from the active state to the pre-charge, the SWD can output an intermediate voltage level on the local word line WL that is at a voltage Vland for a predetermined period of time. In some embodiments, the Vland voltage level can be in a range of 0.2 volt to 0.4 volt such as, for example, 0.3 volt. After the pre-charge state is complete for a given page of memory cells, the memory module can enter an idle state if no other read/write operations are being performed on the memory device. The voltage level on a given local word line, however, will be the same with respect to the pre-charge state and the idle state. Accordingly, the pre-charge state and/or the idle state can be individually or collectively referred to herein as an "off state" with respect to identifying the voltage level on a local word line. However, those skilled in the art understand that the memory device does not necessarily enter the idle state after the pre-charge state of the local word line is complete if the memory device is performing other memory operations.

Each memory bank MB includes one or more FXDRVs that use and/or provide phase signals FX, FXF, FXd, and/or FXd1, which are used to select the SWD based on decoded row address signals and/or timing control signals. In some embodiments, the FXF signal, which can be a complementary signal to the FX signal, is used a timing signal in the FXDRVs. As seen in FIG. 2, the FX, FXF, FXd, and/or FXd1 signals can be provided to a SWD in one or more sections SECT0-SECTn for selecting the appropriate SWD. For example, in some embodiments, each set of FX, FXF, FXd, and/or FXd1 signals from a FXDRV driver can be connected to a SWD in each of a predetermined number of sections in sections SECT0 to SECTn. The predetermined number of sections can be seven sections, and the set of FX, FXF, FXd, and/or FXd1 signals can be connected to a SWD in each of the seven sections. However, in other exemplary embodiments, the predetermined number can be more than seven sections or less than seven sections. In some embodiments, when row hammer stress mitigation is enabled, during the transition from the active state to the pre-charge state, the FXDRV drivers can be configured such that the SWDs can output an intermediate voltage level on the word line WL that is at Vland (e.g., in a range of 0.2 volt to 0.4 volt such as, for example, 0.3 volt). The phase drivers FXDRV are discussed in further detail below.

Figure 3A:
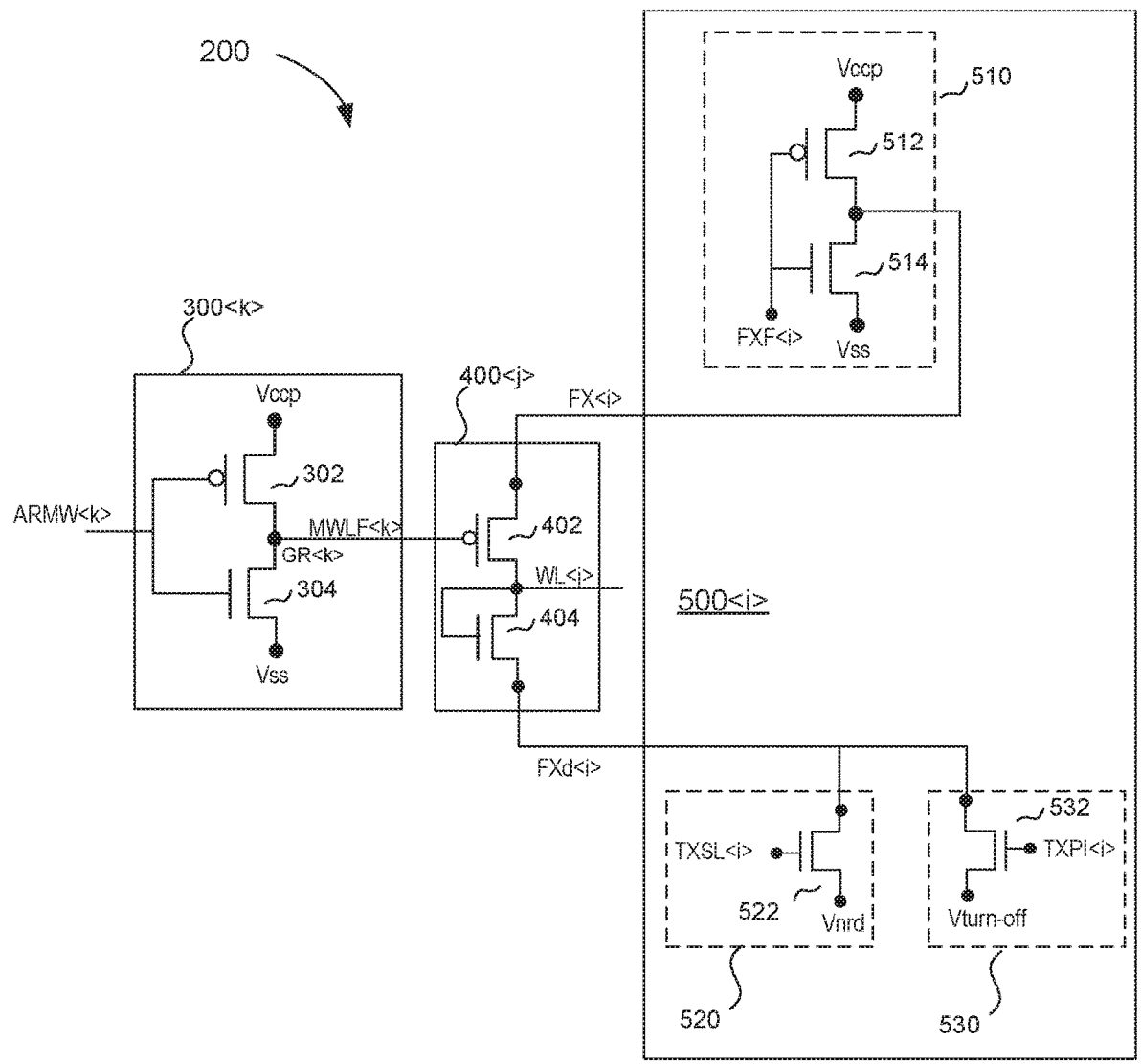
FIG. 3A is a schematic of an embodiment of a word line driver circuit, including a main word line driver, a sub-word line driver, and a phase driver, in accordance with the present disclosure.

FIG. 3A illustrates an exemplary embodiment of a WL drive circuit 200 for driving the voltages on the respective local word lines WL to the active state, the soft-landing state, and/or the off state (e.g., pre-charge state and/or off state). The WL driver circuit 200 includes a plurality of MWDs (e.g., MWDs 300<k>), a plurality of SWDs (e.g., SWDs 400<j>), and a plurality of FXDRVs (e.g., FXDRVs 500<i>) (where k, j and i are integer numbers 0, 1, 2, 3, ... ). Each MWD 300<k> can send a respective MWLF<k> signal on the global word line GR<k> to one or more SWDs 400<j>, which are controlled by respective phase drivers FXDRV 500<i>. As seen in FIG. 3A, each MWD 300<k> can include a transistor 302 of a first type, such as, for example, a PMOS transistor, having a gate coupled to a signal ARMW<k>. The voltage of signal ARMW<k> can correspond to a decoded address signal such as, for example, a portion of a decoded row address. In some embodiments, the decoded row address signal ARMW<k> can correspond to one or more MWDs of a memory bank MB. The source of transistor 302 can be connected to a high voltage source such as, for example, Vccp (e.g., in a range from about 3.0 volts to 3.5 volts such as, for example, 3.2 volts) or some other high voltage level. The drain of the transistor 302 can be connected to a drain of transistor 304, which can be different from the first type, such as, for example a NMOS transistor. The interconnected drains of the transistors 302, 304 are coupled to a global word line GR. The source of transistor 304 can be connected to a low voltage source that can be, for example, Vss (e.g., ground or 0 volts) or some other low voltage level. The gate of the transistor 304 can also be connected to and driven by the ARMW<k> signal. In related art systems, the source of transistor 304 can be connected to a circuit that includes one or more transistors for providing an intermediate voltage for mitigating row hammer (e.g., the soft-landing state) when going from an active state to a pre-charge state. However, in exemplary embodiments of the present technology, the soft-landing driver circuitry is provided by the phase driver FXDRVs 500<i> connected to a corresponding SWD 400<j>. The FXDRV circuitry is discussed below. Accordingly, the MWD 300 circuits of the present technology can have at least one less transistor than related art MWD circuits and thus take up less layout space and consume less power.

FIG. 3A also illustrates an exemplary embodiment of a sub-word line driver 400 that is in accordance with exemplary embodiments of the present technology. Each SWD 400<j> can include a transistor 402 of a first type, such as, for example, a PMOS transistor, having a gate coupled to the respective global word line GR<k> having the signal MWLF<k> from MWD 300<k>. The source of transistor 402 can be configured to receive a FX phase signal from a corresponding FXDRV 500<i>. The drain of the transistor 402 can be connected to a drain of transistor 404, which can be different from the first type, such as, for example a NMOS transistor. In some embodiments, the transistor 404 is configured as a diode-connected transistor with the drain of the transistor 404 connected to the gate of the transistor 404. The interconnected drains of the transistors 402, 404 are coupled to a local word line WL. The source of transistor 404 can be configured to receive a FXd<i> phase signal generated by the FXDDRV 500<i>. In related art systems, each SWD can include three or more transistors to drive the voltage on the local word line WL to the appropriate state, four or more input metal connections (e.g., voltage source inputs, phase signal inputs, and/or global word line inputs), and/or two or more transistors driven by a signal from the corresponding MWD. However, in exemplary embodiments of the present technology, each diode-configured SWD 400 only has two transistors (e.g., transistors 402 and 404) and three inputs (MWLF signal input, FX signal input, and FXd signal input). As used herein, "diode-configured SWD" means that at least one transistor in the SWD is configured as a diode-connected transistor. The simpler design for the SWD reduces the metal (back-end-of-line-BEOL) connection complexity because less connectors are needed. Because there is less metal (BEOL) connections, the parasitic capacitances are less than conventional devices, which leads to lower power consumption. In addition, because the SWDs are constrained to be deployed in a given word line pitch, having less SWDs means there is more flexibility in the layout of the transistors for the SWDs. The diode-configured SWD circuits of the present technology can have at least one less transistor when compared to related art SWD circuits and thus take up less layout space. Compared to related art memory devices, exemplary embodiments of the present technology may require only half the number of NMOS transistors in the pull-down circuits of the SWDs, which can relax the SMD layout design rules and/or CMOS dimension design rules to allow for higher voltage operation which can support higher reliability and performance. In addition, because the MWD 300 only drives one transistor (e.g., PMOS transistor 402) in the SWD 400, the MDW 300 can be smaller in size, which also reduces the layout area and reduces power consumption.

As seen in FIG. 3A, each FXDRV 500<i> phase driver can receive input signals FXF<i>, TXSL<i>, and TXPI<i>, which are decoded row address and/or timing signals from a row decoder (not shown). The FXF<i>, TXSL<i>, and TXPI<i> signals (also referred to herein as "timing signals") can correspond to a memory bank and/or one or more SWDs 400<j> of the memory bank, where X can represent a memory bank and i can represent the corresponding one or more SWDs 400<j> within the memory bank. The FXF<i>, TXSL<i>, and TXPI<i> timing signals can be used by respective phase driver circuits 510, 520, and 530 of the FXDRV 500<i> for generating the phase signals (e.g., FX<i> and FXd<i>) used by the corresponding SWDs 400<j> in driving the voltage on the respective local word lines WL<j>. In some embodiments, each of the phase driver circuits 510, 520, and 530 can be separate circuits, and in other embodiments, the phase driver circuits 510, 520, and 530 can be part of the same circuit.

In some exemplary embodiments, the phase driver circuit 510 can generate a phase signal FX<i>, which can be used by the respective SWD 400<j> to set the local word line WL at the active state voltage Vact (e.g., in a range from about 3.0 volts to 3.5 volts such as, for example, 3.2 volts, or some other high voltage level corresponding to an active state). As seen in FIG. 3A, the phase driver circuit 510 can include a transistor 512 of a first type, such as, for example, a PMOS transistor, having a gate coupled to a timing signal FXF<i>. In some embodiments, the timing signal FXF<i> can correspond to one or more SWDs 400<j>. The source of transistor 512 can be connected to a high voltage source such as, for example, Vccp (e.g., in a range from about 3.0 volts to 3.5 volts such as, for example, 3.2 volts) or some other high voltage level. The drain of the transistor 512 can be connected to a drain of transistor 514, which can be different from the first type, such as, for example a NMOS transistor. The interconnected drains of the transistors 512, 514 are coupled to an output line that transmits a phase signal FX<i>. The source of transistor 514 can be connected to a low voltage source that can be, for example, Vss (e.g., ground or 0 volts) or some other low voltage level. The gate of the transistor 514 can also be connected to and driven by the FXF<i> signal. As seen in FIG. 3A, when the FXF<i> signal is at a high voltage level, the FX<i> signal output by the phase driver circuit 510 has a low voltage level, and when the FXF<i> signal is at a low voltage level, the FX<i> signal output by the phase driver circuit 510 has a high voltage level. Thus, in some embodiments, the phase signal FX<i> can be a compliment of the FXF<i> signal.

In some exemplary embodiments, the phase driver circuit 520 can generate a phase signal FXd<i>, which can be used by the respective SWD 400<j> to set the local word line WL<j> at the soft-landing state voltage Vland (e.g., in a range of 0.2 volts to 0.4 volts such as, for example, 0.3 volts). As seen in FIG. 3A, the phase driver circuit 520 can include a transistor 522 that can be, for example, a NMOS transistor, having a gate coupled to timing signal TXSL<i>. In some embodiments, the timing signal TXSL<i> can correspond to one or more SWDs 400<i>. The source of transistor 522 can be connected to a low voltage source such as, for example, Vnrd (e.g., in a range from about −0.4 volt to −0.6 volt such as, for example, −0.5 volt) or some other low voltage level. The drain of the transistor 522 can be connected to an output line that transmits the phase signal FXd<i> to the SWD 400<j>. When the TXSL<i> signal is at a high voltage level, the FXd<i> signal output by the phase driver circuit 520 has a low voltage level, and when the TXSL<i> signal is at a low voltage level, the phase driver circuit 520 is OFF and the low voltage source, for example Vnrd, is isolated from the SWD 400<j>. Those skilled in the art understand that "isolate" as used herein means a practical isolation between the source and drain of a transistor and does not necessarily mean a total electrical isolation as some leakage current in the transistor can exist in some circumstances.

In some exemplary embodiments, the phase driver circuit 530 can also generate a phase signal FXd<i>, which can be used by the respective SWD 400<j> to set the local word line WL<j> at the off state voltage Voff (e.g., a voltage in a range from about −0.1 volt to −0.3 volt such as, e.g., −0.2 volts). As seen in FIG. 3A, the phase driver circuit 530 can include a transistor 532 that can be, for example, a NMOS transistor, having a gate coupled to timing signal TXPI<i>. In some embodiments, the timing signal TXPI<i> can correspond to one or more SWDs 400<j>. The source of transistor 532 can be connected to a low voltage source such as, for example, Vturn-off (e.g., in a range of −0.7 volt to −0.9 volt such as, e.g., −0.8 volt), or some other low voltage level. The drain of the transistor 532 can be connected to an output line that transmits the phase signal FXd<i> to the SWD 400<j>. When the TXPI<i> signal is at a high voltage level, the FXd<i> signal output by the phase driver circuit 530 has a low voltage level, and when the TXPI<i> signal is at a low voltage level, the phase driver circuit 530 is OFF and the low voltage source, for example Vturn-off, is isolated from the SWD 400<j>. In some embodiments, the timing signals TXSL<i> and TXPI<i> are controlled such that transistors 522 and 532 are not ON at the same time.

In operation, each MWD 300<k> receives the respective ARMW<k> signal and then sets the state of the global word line GR<k> based the value of the ARMW<k> signal. The processor 116 (and/or another processor) can control the decoded row address signal ARMW<k> to operate the MWD 300<k>. The circuit(s) (not shown) to generate the ARMW<k> signal is known in the art and thus, for brevity, will not be discussed further. Based on the voltage value (high level or low level) for the ARMW<k> signal, the MWD 300<k> sets the MWLF<k> signal on the corresponding global word line GR<k> to an active state (e.g., the MWLF<k> signal is at a low voltage level) or a pre-charge or idle state (e.g., the MWLF<k> is at high voltage level). For example, if the row (or rows) corresponding to decoded address signal ARMW<k> is selected, the ARMW<k> signal goes high and transistor 302 is OFF and transistor 304 is ON. With transistor 302 OFF, the voltage Vccp is isolated form the global word line GR<k>. With transistor 304 ON, the voltage Vss (or another low voltage source) is connected to the global word line GR<k> to set the MWLF<k> signal on the global word line GR<k> to a low voltage level, which in this exemplary embodiment corresponds to the active state on the global word line GR. When the row (or rows) corresponding to decoded address signal ARMW<k> is not selected, the ARMW<k> signal goes low and transistor 304 is OFF, which isolates voltage Vss from the global word line GR<k>. In addition, with the ARMW<k> signal low, transistor 302 is ON, which connects the voltage Vccp (or another high voltage source) to the global word line GR<k> and sets the signal MWLF<k> on the global word line GR<k> to a high voltage level, which in this exemplary embodiment corresponds to the pre-charge or idle state on the global word line GR. As discussed above, the high voltage level for the global word line GR<k> can be derived from high voltage source Vccp, which can be in a range from about 3.0 volts to 3.5 volts such as, for example, 3.2 volts. In some embodiments, the high voltage level for the global word line GR<k> can be from another high voltage source such as, for example, Vcc, which can be in a range from about 2.3 volts to 2.7 (e.g., 2.5 volts). The low voltage level for the global word line GR<k> can be derived from low voltage source Vss, which can be ground or 0 volts. In some embodiments, the low voltage level for the global word line GR<k> can be from some other low voltage source.

The SWD 400<j> receives the MWLF<k> signal from MWD 300<k> over the global word line GR<k> and then sets the state of the local word line WL<j> (e.g., active state, soft-landing state, or off state) based the value of the MWLF<k> signal and the FX<i> and FXd<i> phase signals. That is, based on the value of the MWLF<k> signal, the FX<i> signal, and/or the FXd<i> signal, the SWD 400<j> sets the corresponding local word line WL<j> to an active state (e.g., voltage Vact), to a soft-landing state (e.g., voltage Vland), or to an off state (e.g., voltage Voff). For example, to enter the active state on the local word line WL<j>, the MWLF<k> signal at the gate has a low voltage level and the FX<i> signal at the drain has a high voltage level, At this time, the FXd<i> signal value is floating because the source of the transistor 404 is not connected to a voltage source. With the source of transistor 404 not connected to a voltage source, the diode-connected transistor 404 goes OFF. With the MWLF<k> signal at a low voltage level, transistor 402 is ON and pulls up the local word line WL<j> to the FX<i> signal voltage, which is at a high voltage level. The voltage level for the active state on the local word line WL<j> on SWD 400<j> can be Vact (e.g., in a range from about 3.0 volts to 3.5 volts such as, for example, 3.2 volts or some other high voltage level corresponding to an active state).

Once the memory operations (e.g., read/write) are performed at the active state, the voltage on the local word line WL<j> of SWD 400<j> goes to the off state (e.g. pre-charge state and/or idle state). However, in some embodiments, the voltage on the local word line WL<j> is first set to a soft-landing state to mitigate row hammer as the local word line WL<j> goes from the active state (e.g., voltage Vact) to the off state (e.g., voltage Voff). To enter the soft-landing state, the MWLF<k> signal is set to a high voltage level and the FXd<i> signal is set to an intermediate voltage level by connection to an intermediate voltage source (e.g., Vnrd) (the voltage of the FX<j> signal does not matter). With MWLF<k> signal high and the FXd<i> signal low, the transistor 402 is OFF and the diode-connected transistor 404 is ON. With transistor 402 OFF, the FX<i> signal is isolated from the local word line WL<j>. With the transistor 404 ON, the voltage on the local word line WL<j> will be pulled down to a voltage that is slightly above that of the intermediate voltage source (e.g., Vnrd) of the FXd<i> signal by the threshold voltage Vth of the transistor 404 but well below the active state voltage. The voltage level for the soft-landing state on the local word line WL<j> on SWD 400<j> can be Vland (e.g., in a range of 0.2 volts to 0.4 volts such as, for example, 0.3 volts). In some embodiments, the Vland voltage at the local word line WL<j> can be adjusted by tuning the Vnrd voltage source. For example, the soft-landing state voltage Vland can be set during factory setup and/or during in-service operations by tuning (e.g., via mode register settings) the output voltage of Vnrd (or another appropriate voltage source).

After the local word line WL<j> on SWD 400<j> is at the soft-landing state for a predetermined period of time, the voltage on the local word line WL<j> is set to the off state (e.g., voltage Voff). To enter the off state on the local word line WL<j>, the MWLF<k> signal has a high voltage level and the FXd<i> signal is set to a low voltage level by connection to a low voltage source (e.g., Vturn-off) (the voltage of the FX<i> signal does not matter). With MWLF<k> signal high and the FXd<i> signal low, the transistor 402 is OFF and the transistor 404 is ON. With transistor 402 OFF, the FX<i> signal is isolated from the local word line WL<j>. With the transistor 404 ON, the voltage on the local word line WL<j> will be pulled down to a voltage level that is slightly above that of the FXd<i> signal by the threshold voltage Vth of the transistor 404 but well below the active voltage. The voltage level for the pre-charge state or the idle state on the local word line WL<j> on SWD 400<j> can be Voff (e.g., a voltage in a range from about −0.1 volt to −0.3 volt such as, e.g., −0.2 volts). In some embodiments, the Voff voltage at the local word line WL<j> can be adjusted by tuning the Vturn-off voltage source. For example, the off state voltage Voff can be set during factory setup and/or during in-service operations by tuning (e.g., via mode register settings) the output voltage of Vturn-off (or another appropriate voltage source).

Figure 3B:
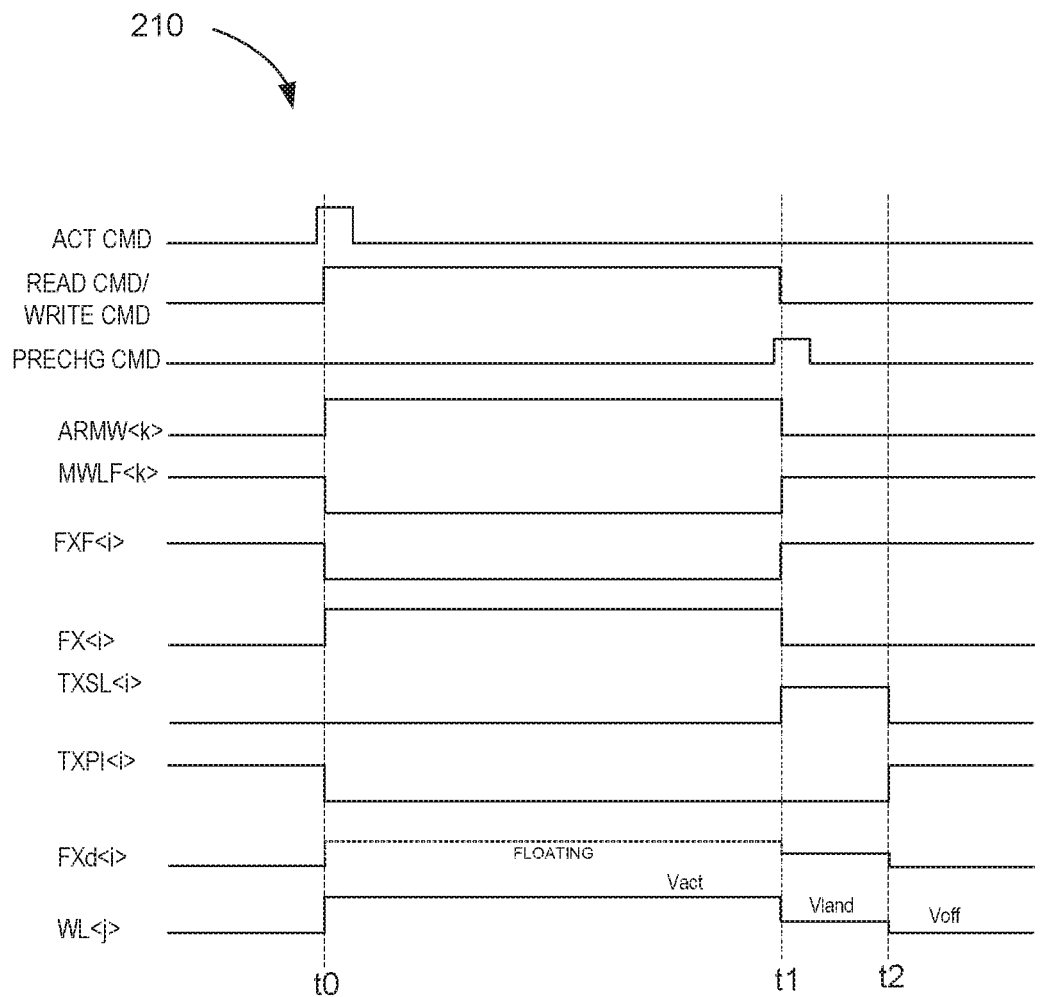
FIG. 3B is a signal timing diagram of the word line driver circuit of FIG. 3A.

FIG. 3B illustrates an exemplary timing diagram 210 for the operation of the WL drive circuit 200 of FIG. 3A. In the timing diagram 210, for clarity, certain dependent signals may be shown changing state at the same time as the respective base signal. However, those skilled in the art will understand that these depend signals will change state slightly after the corresponding base signal changes state. For example, the state of signal FX<i> is depend on the state of FXF<i> and, although shown as changing state at the same time on chart 210, those skilled in the art will understand that the signal FX<i> will change state slightly after the signal FXF<i> changes state. Turning to FIGS. 3A and 3B, the processor 116 (and/or another processor) can issue an active command ACT CMD to circuitry (not shown) that controls the input signals to the WL drive circuit 200 so as to drive the appropriate local word line WL<j> to the active state (e.g., voltage Vact), to the soft-landing state (e.g., voltage Vland), and/or to the off state (e.g., voltage Voff). For example, slightly before time t0, the processor 116 (and/or another processor) issues the ACT CMD signal that controls the WL drive circuit 200 so as to drive the appropriate local word line WL<j> to the active state (e.g., voltage Vact) at time t0. As seen in FIG. 3B, at time t0, the decoded row address ARMW<k> can go from a low voltage level to a high voltage level to select an MWD 300<k>. At this time, the output signal MWLF<k> of the respective MDW 300<k> goes low to enter the active state on the respective global word line GR<k>, as discussed above. For example, the value of global word line GR<k> can be at Vss (or another low voltage level). At the same time, for example, processor 116 (and/or another processor) can control the signal FXF<i> so that the FXF<i> signal goes from a high voltage level to a low voltage level. Based on the FXF<i> signal going to a low voltage level, the output phase signal FX<i> of the phase driver circuit 510 of FXDRV 500<i> goes to a high voltage level. As discussed above, with the MWLF<k> signal at a low voltage level and the FX<i> signal at a high voltage level, the local word line WL<j> is set to the active state (e.g., voltage Vact) by the SWD 400<j>. During this time (e.g., from t0 to t1), the processor 116 (and/or another processor) can control the timing signals TXSL<i> and TXPI<i> so that they are set to a low voltage level. As discussed above, with the signals TXSL<i> and TXPI<i> at low voltage levels, the phase drivers 520 and 530 of FXDRV 500<i> are off and the voltage value of signal FXd<i> is floating. During the time that the local word line WL<j> is at the active state (e.g., from t0 to t1), the memory cells attached WL<j> can be accessed for memory operations (e.g., read, write, etc.). Accordingly, as seen in FIG. 3B during the period between t0 and t1, the processor 116 (and/or another processor) can issue a read command READ CMD and/or write command a WRITE CMD to circuitry (not shown) to perform the appropriate memory operation (e.g., read, write, etc.) when, for example, the appropriate READ CMD/WRITE CMD signal is high. Of course, in some embodiments, the circuitry can be configured such that memory operations occur when the appropriate signal is low.

After the memory operation is performed, the processor 116 (and/or another processor) can issue a pre-charge command to circuitry (not shown) that controls the input signals to the WL drive circuit 200 so as to drive the appropriate local word line WL<j> from the active state (e.g., voltage Vact) to a soft-landing state (e.g., voltage Vland) to mitigate the row hammer. For example, as seen in FIG. 3B, slightly before time t1, the processor 116 (and/or another processor) issues the PRECHG signal such that the decoded row address ARMW<k> can go from a high voltage level to a low voltage level at time t1 to deselect the MWD 300<k>. At this time, the output signal MWLF<k> of the respective MDW 300<k> goes high to enter the pre-charge state or idle state on the respective global word line GR<k>. For example, the value of global word line GR<k> can be at Vccp (or another high voltage level). At the same time, for example, processor 116 (and/or another processor) can control the signal FXF<i> so that the FXF<i> signal goes from a low voltage level to a high voltage level. Based on the FXF<i> signal going to a high voltage level, the output phase signal FX<i> of the phase driver circuit 510 of FXDRV 500<i> goes to a low voltage level. At this time (e.g., time t1), the processor 116 (and/or another processor) can control the timing signal TXSL<i> so that the timing signal TXSL<i> is set to a high voltage level for a predetermined period of time (e.g., from t1 to t2). During this time (e.g., t1 to t2), the signal TXPI<i> is still set to a low voltage level. As discussed above, with the signal TXSL<i> set to a high voltage level, the phase driver 520 of FXDRV 500<i> is on and the FXd<i> signal is connected to, for example, a voltage source Vnrd having an intermediate voltage level (e.g., to mitigate row hammer). With the MWLF<k> signal at a high voltage level and the FX<i> signal at a low voltage level, the local word line WL<j> is set to the soft-landing state (e.g., voltage Vland) by the SWD 400<j>.

At time t2, the processor 116 (and/or another processor) can control the WL drive circuit 200 so as to drive the appropriate local word line WL<j> from the soft-land state (e.g., voltage Vland) to an off state (e.g., voltage Voff) to enter the pre-charge state and/or the idle state. As discussed above, the off state can correspond to the pre-charge state and/or idle state. As seen in FIG. 3B, at time t2, the processor 116 (and/or another processor) can control the timing signal TXSL<i> so that the timing signal TXSL<i> is set to a low voltage level and the timing signal TXPI<i> is set to a high voltage level. As discussed above, with the signal TXSL<i> set to a low voltage level and the signal TXPI<i> set to a high voltage level, the phase driver 520 of FXDRV 500<i> is on and the phase driver 530 is off. Thus, at time t2, the FXd<i> signal is connected to, for example, a voltage source Vturn-off having a low voltage level. With the MWLF<k> signal at a high voltage level and the FX<i> signal at a low voltage level, the local word line WL<j> is set to the off state (e.g., voltage Voff) by the SWD 400<j>.

Figure 4A:
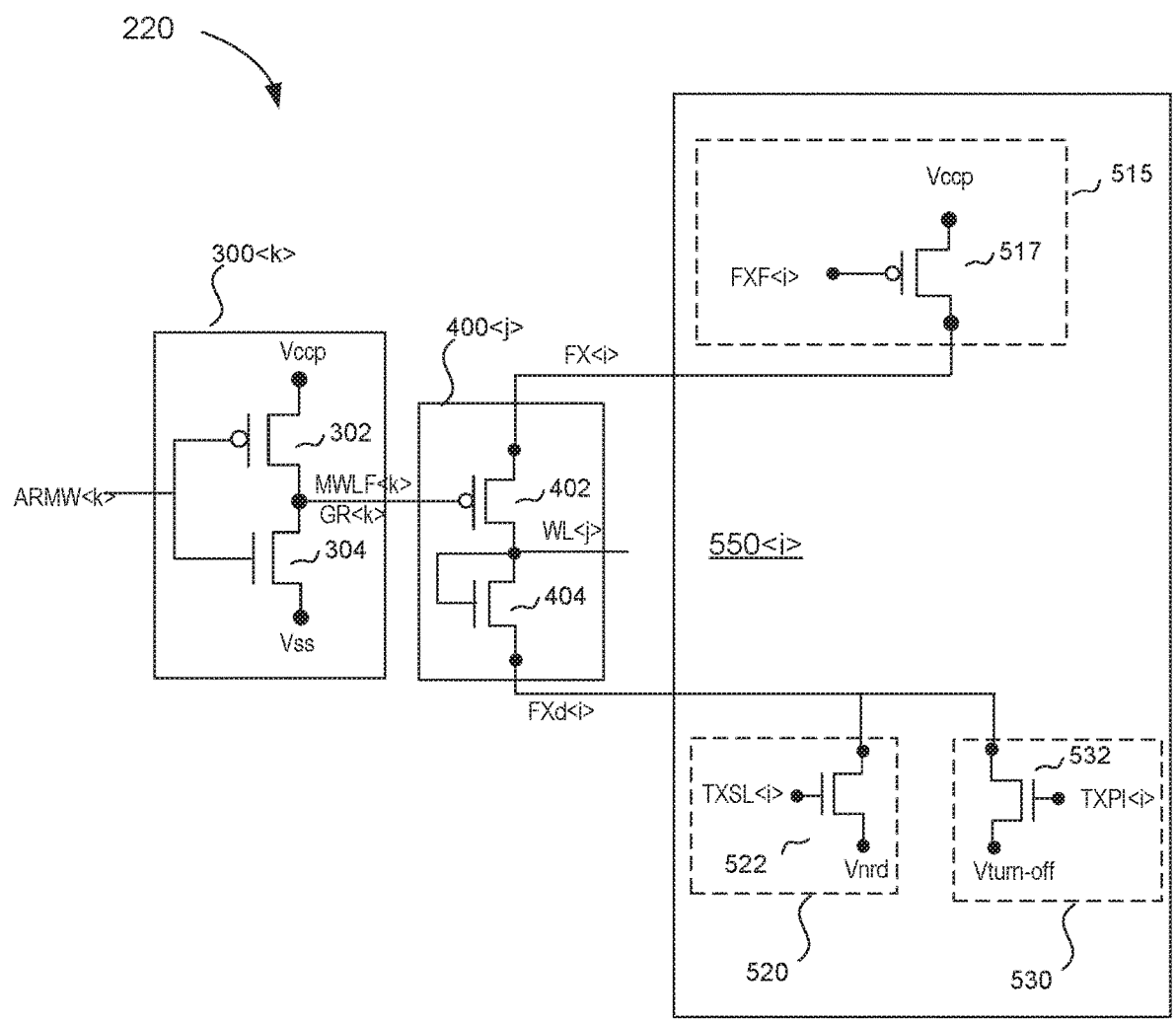
FIG. 4A is a schematic of an embodiment of another word line driver circuit, including a main word line driver, a sub-word line driver, and a phase driver, in accordance with the present disclosure.
Figure 4B:
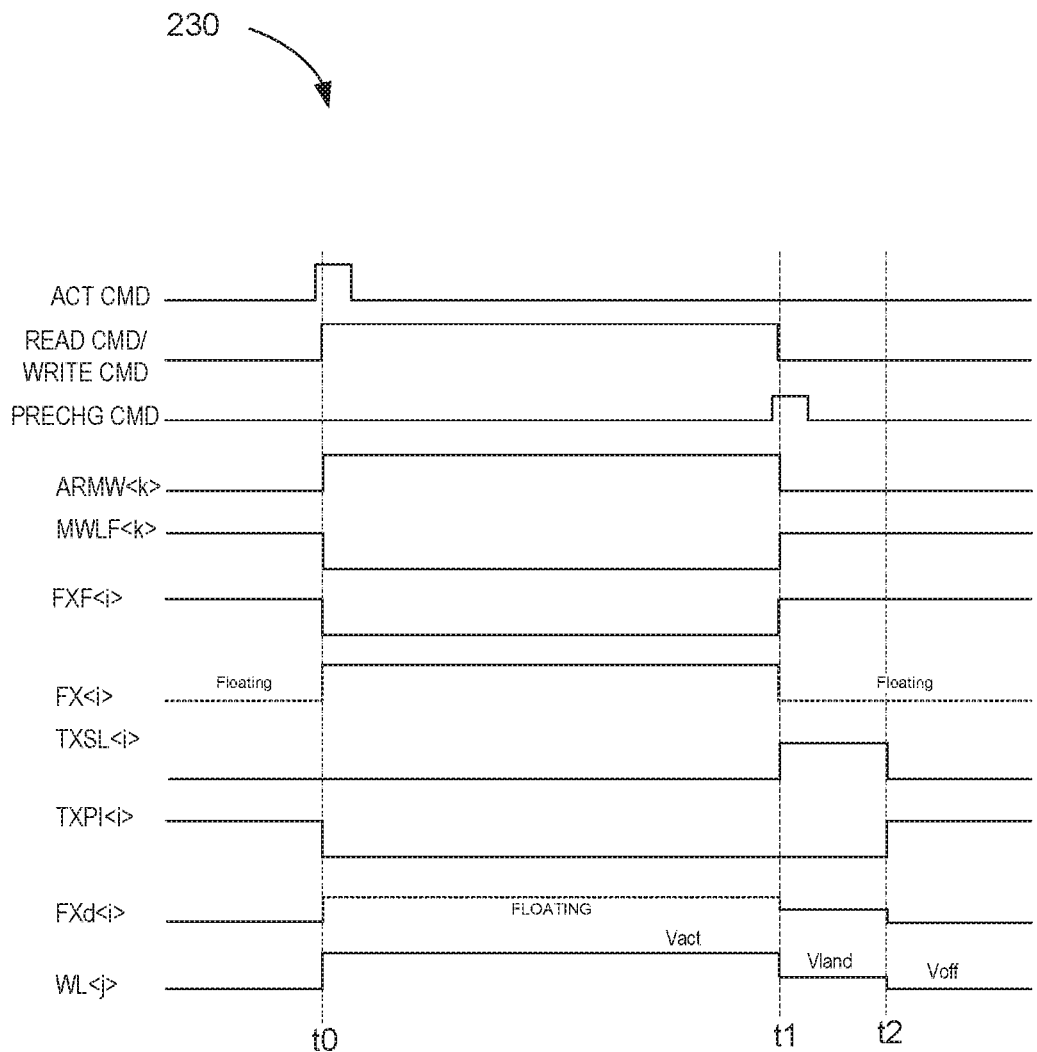
FIG. 4B is a signal timing diagram of the word line driver circuit of FIG. 4A.

FIG. 4A illustrates another exemplary embodiment of a WL drive circuit in accordance with the present technology. Those skilled in the art will recognize that WL drive circuit 220 is similar to WL drive circuit 200 but that FXDRV 550 in WL drive circuit 220 is different from FXDRV 500 in WL drive circuit 200. More specifically, the phase driver circuit 515 is different from the phase driver circuit 510 in that the phase driver circuit 515 does not include a pull-down transistor like transistor 514. Accordingly, the embodiment of FIG. 4A further optimizes the layout area of the FX drive circuits over the embodiment in FIG. 3A. However, those skilled in the art will recognize that, when the timing signal FXF<i> is at a high voltage level (e.g., corresponding to a soft-landing or off state), the transistor 517 is OFF and the FX<i> signal connection to the SWD 400<j> is isolated from a voltage source. Thus, the source of transistor 402 (FX<i> signal connection) will have a floating voltage during the pre-charge and off states. For example, the source of transistor 402 will have a floating voltage value of approximately 0.4 volt (Voff (−0.2 volt)+Vthp (approx. 0.6 volt)=0.4 volt, where Vthp is threshold voltage of PMOS transistor 402). Thus, the phase driver circuits in the embodiment of FIG. 4A require less area than the phase driver circuits of FIG. 3A. In contrast, because the FX<i> signal is not at a floating voltage (which can swing due to induced voltages), the embodiment of FIG. 3A can provide a more stable phase driver circuit than that of FIG. 4A in some cases. For brevity, a description of the remaining circuit configurations of WL driver circuit 210 is omitted because those skilled in the art will recognize that they are similar to those of WL driver circuit 200, discussed above. FIG. 4B illustrates a timing diagram 230 for the WL drive circuit 220. As seen in FIG. 4B, the FX<i> signal is at a floating voltage when not driven to an active state (e.g., voltage Vact). Those skilled in the art recognize that the remaining timing functions and operations of the WL drive circuit 220 are similar to WL drive circuit 200 discussed above and thus, for brevity, will not be repeated.

Figure 5A:
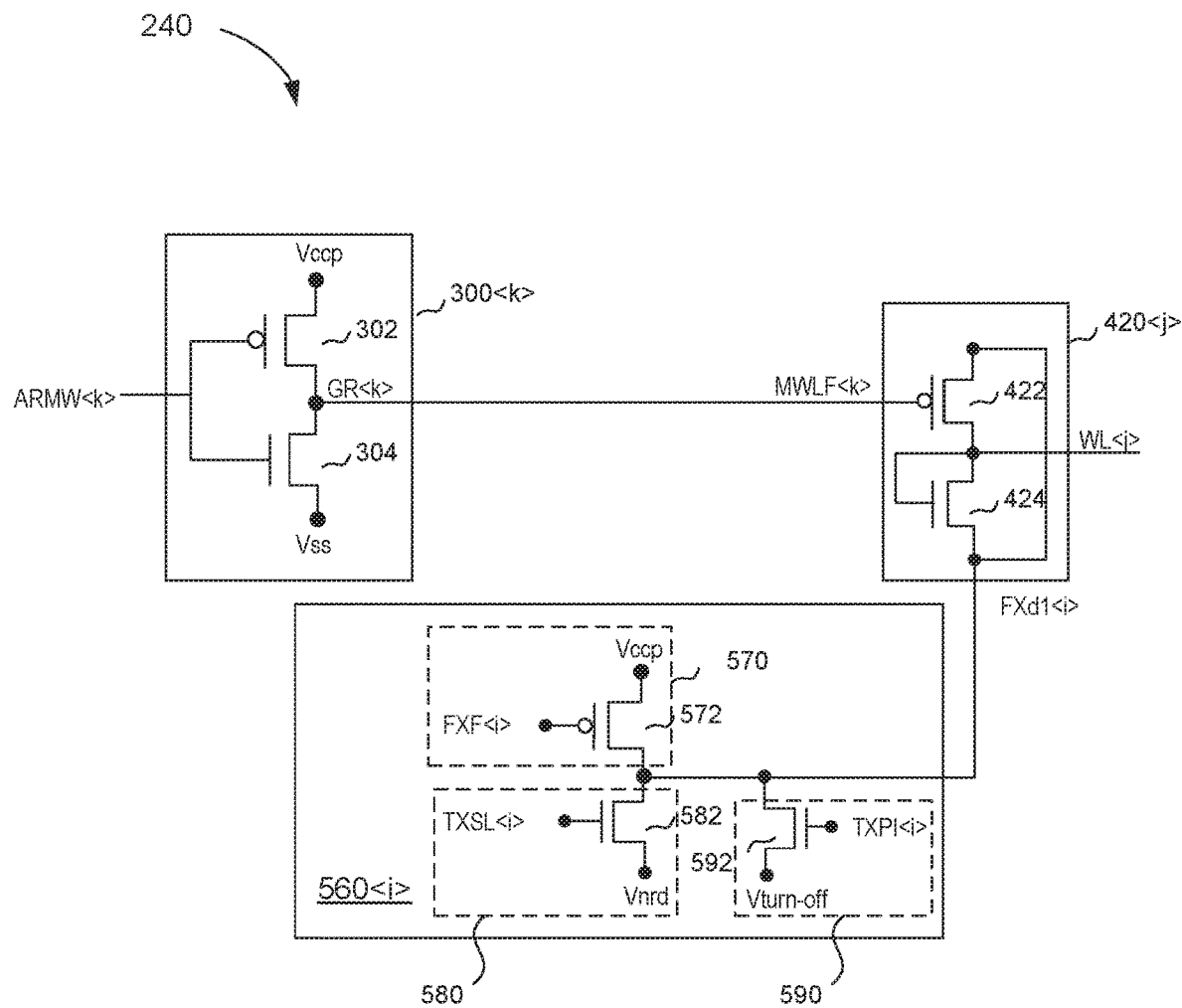
FIG. 5A is a schematic of an embodiment of another word line driver circuit, including a main word line driver, a sub-word line driver, and a phase driver, in accordance with the present disclosure.

FIG. 5A illustrates still another exemplary embodiment of a WL drive circuit in accordance with the present technology. Similar to the WL drive circuit 200, the WL drive circuit 240 drives the voltages on the respective local word lines WL to the active state, soft-landing state, and off state. The WL driver circuit 240 includes MWDs 300<k>, SWDs 420<j>, and FXDRVs 560<i>. Each MWD 300<k> can send a respective MWLF<k> signal on the global word line GR<k> to one or more SWDs 420<j>, which are controlled by respective phase drivers FXDRVs 560<i>. Those skilled in the art will recognize that the configuration and operation of the MWD 300<k> in the WL drive circuit 240 is similar to that of MWD 300<k> in WL drive circuit 200 and thus, for brevity, will not be repeated.

The SWD 420<j> can include a transistor 422 of a first type, such as, for example, a PMOS transistor, having a gate coupled to the signal MWLF<k> from MWD 300<k>. The drain of the transistor 422 can be connected to a drain of transistor 424, which can be different from the first type, such as, for example a NMOS transistor. In some embodiments, the transistor 424 is configured as a diode-connected transistor with the drain connected to the gate. The interconnected drains of the transistors 422, 424 are coupled to a local word line WL<j>. The source of transistor 422 can be connected to the source of transistor 424. The source connection of transistors 422 and 424 receive a FXd1<i> phase signal generated by FXDRV 560<i>. As seen in FIG. 5A, the number of inputs connections to SWD 420<j> is reduced by one over the SWD 400<j> embodiment of FIG. 3A, and thus further optimizes the layout area for the SWDs with respect to related art SWDs and even with respect to SWD 400. However, because the SWD 400 can accept phase signals that can be different, SWD 400 can provide for more flexibility and/or reliability with respect to phase driver configurations. Similar to exemplary embodiments discussed above, SWD 420<j> can exclusively use two transistors to drive the voltage on the local word line WL<j>. In addition, the SWD 420<j> can be a diode-configured SWD having a diode-connected transistor 424. Similar to the embodiments discussed above, because the MWD 300<k> only drives one transistor (e.g., PMOS transistor 422) in the SWD 420<j>, the MDW 300<k> can be smaller in size, which reduces the layout area.

As seen in FIG. 5A, each FXDRV 560<i> phase driver can receive input timing signals FXF<i>, TXSL<i>, and TXPI<i>. The FXF<i>, TXSL<i>, and TXPI<i> timing signals can be used by respective phase driver circuits 570, 580, and 590 of the FXDRV 560<i> for generating the phase signal (e.g., FXd1<i>) used by the corresponding SWDs 420<j> in driving the voltage on the respective local word lines WL<j>. In some embodiments, each of the phase driver circuits 570, 580, and 590 can be separate circuits, and in other embodiments, the phase driver circuits 570, 580, and 590 can be part of the same circuit.

In some exemplary embodiments, the phase driver circuit 570 can generate a phase signal FXd1<i> that is at a high voltage level, which can be used by the respective SWD 420<j> to set the local word line WL<j> at the active state voltage Vact (e.g., in a range from about 3.0 volts to 3.5 volts such as, for example, 3.2 volts, or some other high voltage level corresponding to an active state). As seen in FIG. 5A, the phase driver circuit 570 can include a transistor 572, such as, for example, a PMOS transistor, having a gate coupled to a timing signal FXF<i>. In some embodiments, the timing signal FXF<i> can correspond to one or more SWDs 420<j>. The source of transistor 572 can be connected to a high voltage source such as, for example, Vccp (e.g., in a range from about 3.0 volts to 3.5 volts such as, for example, 3.2 volts), or some other high voltage level. The drain of the transistor 572 can be connected to an output line that transmits the phase signal FXd1<i> to, for example, the source of transistor 422 and the source of transistor 424 of the SWD 400<j>. When the FXF<i> signal is at a low voltage level (corresponding to an active state), the FXd1<i> signal output by the phase driver circuit 572 is connected to the high voltage source (e.g., Vccp). When the FXF<i> signal is at a high voltage level, the transistor 572 is OFF and the high voltage source (e.g., Vccp) is isolated from the SWD 400<j>.

In some exemplary embodiments, the phase driver circuit 580 can generate a phase signal FXd1<i>, which can be used by the respective SWD 420<j> to set the local word line WL<j> at the soft-landing state voltage Vland (e.g., in a range of 0.2 volts to 0.4 volts such as, for example, 0.3 volts). As seen in FIG. 5A, the phase driver circuit 580 can include a transistor 582 that can be, for example, a NMOS transistor, having a gate coupled to timing signal TXSL<i>. In some embodiments, the timing signal TXSL<i> can correspond to one or more SWDs 420<j>. The source of transistor 582 can be connected to a low voltage source such as, for example, Vnrd (e.g., in a range from about −0.4 volt to −0.6 volt such as, for example, −0.5 volt), or some other low voltage level. The drain of the transistor 582 can be connected to an output line that transmits the phase signal FXd1<i> to, for example, the source of transistor 422 and the source of transistor 424 of the SWD 420<j>. When the TXSL<i> signal is at a high voltage level, the FXdi<i> signal output by the phase driver circuit 580 has a low voltage level, and when the TXSL<i> signal is at a low voltage level, the phase driver circuit 520 is OFF and the low voltage source, for example Vnrd, is isolated from the SWD 400<j>.

In some exemplary embodiments, the phase driver circuit 590 can generate a phase signal FXd1<i> that is at a low voltage level, which can be used by the respective SWD 420<j> to set the local word line WL<j> at the off state voltage Voff (e.g., a voltage in a range from about −0.1 volt to −0.3 volt such as, e.g., −0.2 volts). As seen in FIG. 5A, the phase driver circuit 590 can include a transistor 592 that can be, for example, a NMOS transistor, having a gate coupled to timing signal TXPI<i>. In some embodiments, the timing signal TXPI<i> can correspond to one or more SWDs 420<j>. The source of transistor 592 can be connected to a low voltage source such as, for example, Vturn-off (e.g., in a range of −0.7 volt to −0.9 volt such as, e.g., −0.8 volt), or some other low voltage level. The drain of the transistor 592 can be connected to an output line that transmits the phase signal FXd1<i> to, for example, the source of transistor 422 and the source of transistor 424 of the SWD 400<j>. When the TXPI<i> signal is at a high voltage level, the FXd1<i> signal output by the phase driver circuit 590 has a low voltage level, and when the TXPI<i> signal is at a low voltage level, the phase driver circuit 590 is OFF and the low voltage source, for example Vturn-off, is isolated from the SWD 420<j>. In some embodiments, the timing signals FXF<i>, TXSL<i>, and TXPI<i> are controlled such that transistors 572, 582, and 592 are not ON at the same time.

The operation of MDW 300<k> in WL driver circuit 240 is the same as that of MDW 300<k> in WL driver circuit 200 and thus, for brevity, will not be repeated. With respect to the SWD 420<j>, the SWD 420<j> receives the MWLF<j> signal from MWD 300<k> over the global word line GR<k> and then sets the state of the local word line WL<j> (e.g., active state, soft-landing state, or off state) based the value of the MWLF<k> signal and the FXd1<i> phase signal. That is, based on the value of the MWLF<k> signal and/or the FXd1<i> signal, the SWD 420<j> sets the corresponding local word line WL<j> to an active state (e.g., voltage Vact), to a soft-landing state (e.g., voltage Vland), or to a pre-charge or an idle state (e.g., voltage Voff). For example, to enter the active state on the local word line WL<j>, the FXd1<i> signal at the sources of the transistor 422 and 424 is at a high voltage level and the MWLF<k> signal at the gate has a low voltage level. With the source of transistor 422 at a high voltage level and the gate of transistor 422 at a low voltage level, the transistor 422 goes ON and pulls up the voltage on local word line WL<j> to the FXD1<i> signal voltage, which is at a high voltage level. With the source of transistor 424 at a high voltage level, the diode-connected transistor 424 is OFF. The voltage level for the active state on the local word line WL<j> on SWD 420<j> can be Vact (e.g., in a range from about 3.0 volts to 3.5 volts such as, for example, 3.2 volts, or some other high voltage level corresponding to an active state).

Once the memory operations (e.g., read/write) are performed at the active state, the voltage on the local word line WL<j> of SWD 420<j> goes to the off state. However, in some embodiments, the voltage on the local word line WL<j> is first set to a soft-landing state to mitigate row hammer as the local word line WL<j> goes from the active state (e.g., voltage Vact) to the pre-charge or idle state (e.g., voltage Voff). To enter the soft-landing state, the FXd1<i> signal is set to an intermediate voltage level by connecting to an intermediate voltage source (e.g., Vnrd) (the voltage of the MWLF signal does not matter). With the FXd1<i> signal low, the transistor 422 is OFF and the diode-connected transistor 424 is ON. With the transistor 424 ON, the voltage on the local word line WL<j> will be pulled down to a voltage that is slightly above that of the intermediate voltage source (e.g., Vnrd) of the FXd1<i> signal by the threshold voltage Vth of the transistor 424 but well below the active state voltage. The voltage level for the soft-landing state on the local word line WL<j> on SWD 420<j> can be Vland (e.g., in a range of 0.2 volts to 0.4 volts such as, for example, 0.3 volts). In some embodiments, the Vland voltage at the local word line WL<j> can be adjusted by tuning the Vnrd voltage source. For example, the soft-landing state voltage Vland can be set during factory setup and/or during in-service operations by tuning (e.g., via register settings) the output voltage of Vnrd (or another appropriate voltage source).

After the local word line WL<j> on SWD 420<j> is at the soft-landing state for a predetermined period of time, the voltage on the local word line WL<j> is set to the off state (e.g., voltage Voff). To enter the pre-charge or idle state on the local word line WL<j>, the FXd1<i> signal is set to a low voltage level by connection to a low voltage source (e.g., Vturn-off) (the voltage of the MWLF signal does not matter). With the FXd1<i> signal low, the transistor 422 is OFF and the diode-connected transistor 424 is ON. With the transistor 424 ON, the voltage on the local word line WL<j> will be pulled down to a voltage that is slightly above that of the FXd1<i> signal by the threshold voltage Vth of the transistor 424 but well below the active voltage. The voltage level for the pre-charge state or the idle state on the local word line WL<j> on SWD 420<j> can be Voff (e.g., a voltage in a range from about −0.1 volt to −0.3 volt such as, e.g., −0.2 volts). In some embodiments, the Voff voltage at the local word line WL<j> can be adjusted by tuning the Vturn-off voltage source. For example, the off state voltage Voff can be set during factory setup and/or during in-service operations by tuning (e.g., via register settings) the output voltage of Vturn-off (or another appropriate voltage source).

Figure 5B:
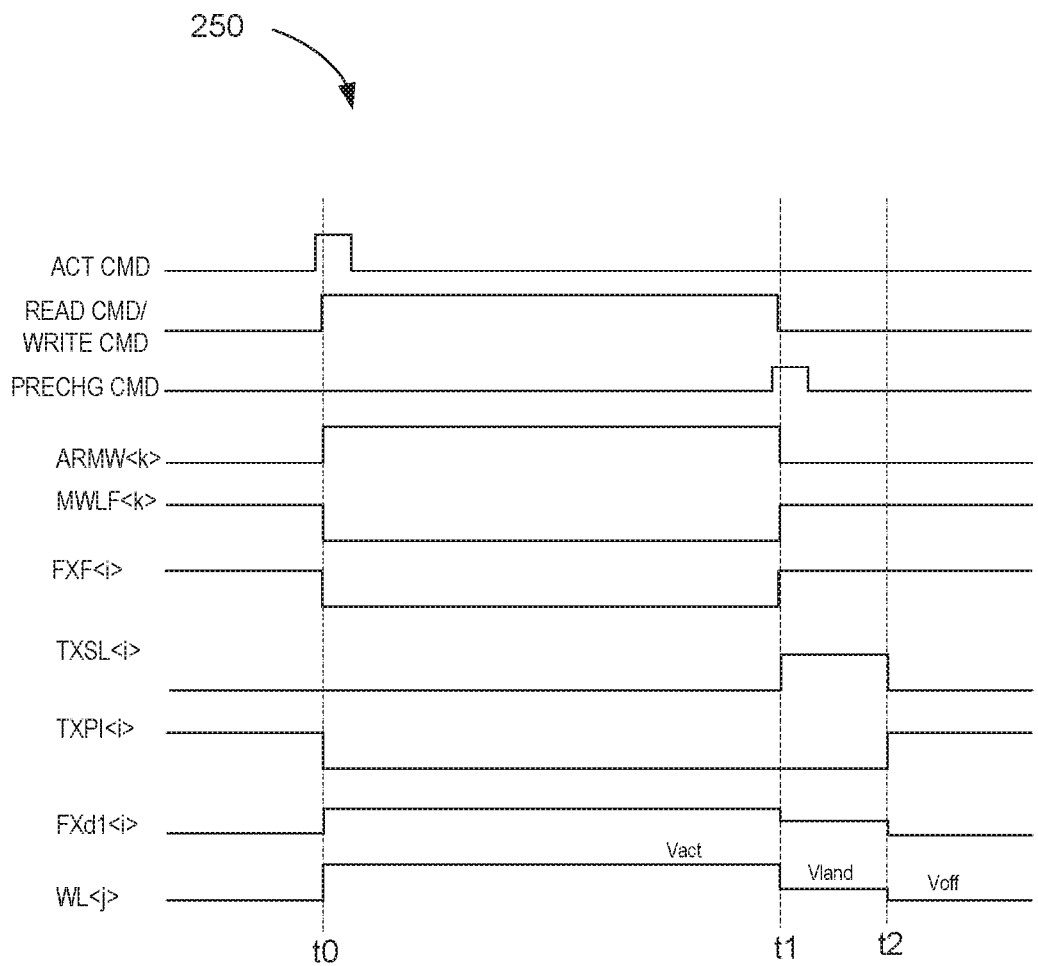
FIG. 5B is a signal timing diagram of the word line driver circuit of FIG. 5A.

FIG. 5B illustrates an exemplary timing diagram 250 for the operation of the WL drive circuit 240 of FIG. 5A. As in timing diagram 210, for clarity, certain dependent signals may be shown changing state at the same time as the respective base signal in timing diagram 250. Turning to FIGS. 5A and 5B, the processor 116 (and/or another processor) can issue an active command ACT CMD to circuitry (not shown) that controls the input signals to the WL drive circuit 240 so as to drive the appropriate local word line WL<j> to the active state (e.g., voltage Vact), to the soft-landing state (e.g., voltage Vland), and/or to the pre-charge or idle state (e.g., voltage Voff). For example, slightly before time t0, the processor 116 (and/or another processor) issues the ACT CMD signal that controls the WL drive circuit 240 so as to drive the appropriate local word line WL<j> to the active state (e.g., voltage Vact) at time t0. As seen in FIG. 5B, at time t0, the decoded row address ARMW<k> can go from a low voltage level to a high voltage level to select an MWD 300<k>. At this time, the output signal MWLF<k> of the MDW 300<k> goes low to enter the active state on global word line GR<k>, as discussed above. For example, the value of global word line GR<k> can be at Vss (or another low voltage level). At the same time, for example, processor 116 (and/or another processor) can control the signal FXF<i> so that the FXF<i> signal goes from a high voltage level to a low voltage level. Based on the FXF<i> signal going to a low voltage level, the output phase signal FXd1<i> of the phase driver circuit 570 of FXDRV 550<i> goes to a high voltage level. As discussed above, with the MWLF<k> signal at a low voltage level and the FX<i> signal at a high voltage level, the local word line WL<j> is set to the active state (e.g., voltage Vact) by the SWD 420<j>. During this time (e.g., from t0 to t1), the processor 116 (and/or another processor) can control the timing signals TXSL<i> and TXPI<i> so that they are set to a low voltage level. During the time that the local word line WL<j> is at the active state (e.g., from t0 to t1), the memory cells attached WL<j> can be accessed for memory operations (e.g., read, write, etc.). Accordingly, as seen in FIG. 5B during the period between t0 and t1, the processor 116 (and/or another processor) can issue a read command READ CMD and/or write command a WRITE CMD to circuitry (not shown) to perform the appropriate memory operation (e.g., read, write, etc.) when, for example, the appropriate READ CMD/WRITE CMD signal is high. Of course, in some embodiments, the circuitry can be configured such that memory operations occur when the appropriate signal is low.

After the memory operation is performed, the processor 116 (and/or another processor) can issue a pre-charge command to circuitry (not shown) that controls the WL drive circuit 240 so as to drive the appropriate local word line WL<j> from the active state (e.g., voltage Vact) to a soft-landing state (e.g., voltage Vland) to mitigate the row hammer. For example, as seen in FIG. 5B, slightly before time t1, the processor 116 (and/or another processor) issues the PRECHG signal such that the decoded row address ARMW<k> can go from a high voltage level to a low voltage level at time t1 to deselect the MWD 300<k>. At this time, the output signal MWLF<k> of the respective MWD 300<k> goes high to enter the pre-charge or idle state on the respective global word line GR<k>. For example, the value of global word line GR<k> can be at Vccp (or another high voltage level). At the same time, for example, processor 116 (and/or another processor) can control the signal FXF<i> so that the FXF<i> signal goes from a low voltage level to a high voltage level. Based on the FXF<i> signal going to a high voltage level, the phase driver circuit 570 of FXDRV 550<i> is off. At this time (e.g., time t1), the processor 116 (and/or another processor) can control the timing signal TXSL<i> so that the timing signal TXSL<i> is set to a high voltage level for a predetermined period of time (e.g., from t1 to t2). During this time (e.g., t1 to t2), the signal TXPI<i> is still set to a low voltage level. As discussed above, with the signal TXSL<i> set to a high voltage level, the phase driver 580 of FXDRV 550<i> is on and the FXd1<i> signal is connected to, for example, a voltage source Vnrd having an intermediate voltage level (e.g., to mitigate row hammer). With the FX<i> signal at a low voltage level, the local word line WL<j> is set to the soft-landing state (e.g., voltage Vland) by the SWD 420<j>.

At time t2, the processor 116 (and/or another processor) can control the WL drive circuit 240 so as to drive the appropriate local word line WL<j> from the soft-land state (e.g., voltage Vland) to an off state (e.g., voltage Voff) to enter the pre-charge state and/or the idle state. As discussed above, the off state can correspond to the pre-charge state and/or idle state. As seen in FIG. 5B, at time t2, the processor 116 (and/or another processor) can control the timing signal TXSL<i> so that the timing signal TXSL<i> is set to a low voltage level and the timing signal TXPI<i> is set to a high voltage level. As discussed above, with the signal TXPI<i> set to a high voltage level, the phase driver 590 of FXDRV 550<i> is on. Thus, at time t2, the voltage value of signal FXd1<i> is set to a low voltage level. With the FX<i> signal at a low voltage level, the local word line WL<j> is set to the off state (e.g., voltage Voff) by the SWD 420<j>.

As discussed above, the high voltage level Vact for the local word line WL can come from voltage source Vccp, which can be in a range from about 3.0 volts to 3.5 volts such as, for example, 3.2 volts. In some embodiments, the high voltage level Vact for the local word line WL can come from another high voltage source (e.g., Vcc, which can be in a range from about 2.3 volts to 2.7 volts such as, for example, 2.5 volts). The intermediate voltage level Vland for the local word line WL can come from voltage source Vnrd, which can be in arrange of −0.4 volt to −0.6 volt such as, e.g., −0.5 volt. In some embodiments, the intermediate voltage level Vland can come from some other voltage source. Similarly, the low voltage level Voff for the local word line WL can come from voltage source Vturn-off, which can be in a range of −0.7 volt to −0.9 volt such as, e.g., −0.8 volt. In some embodiments, the low voltage level Voff can come from some other voltage source.

Figure 6:
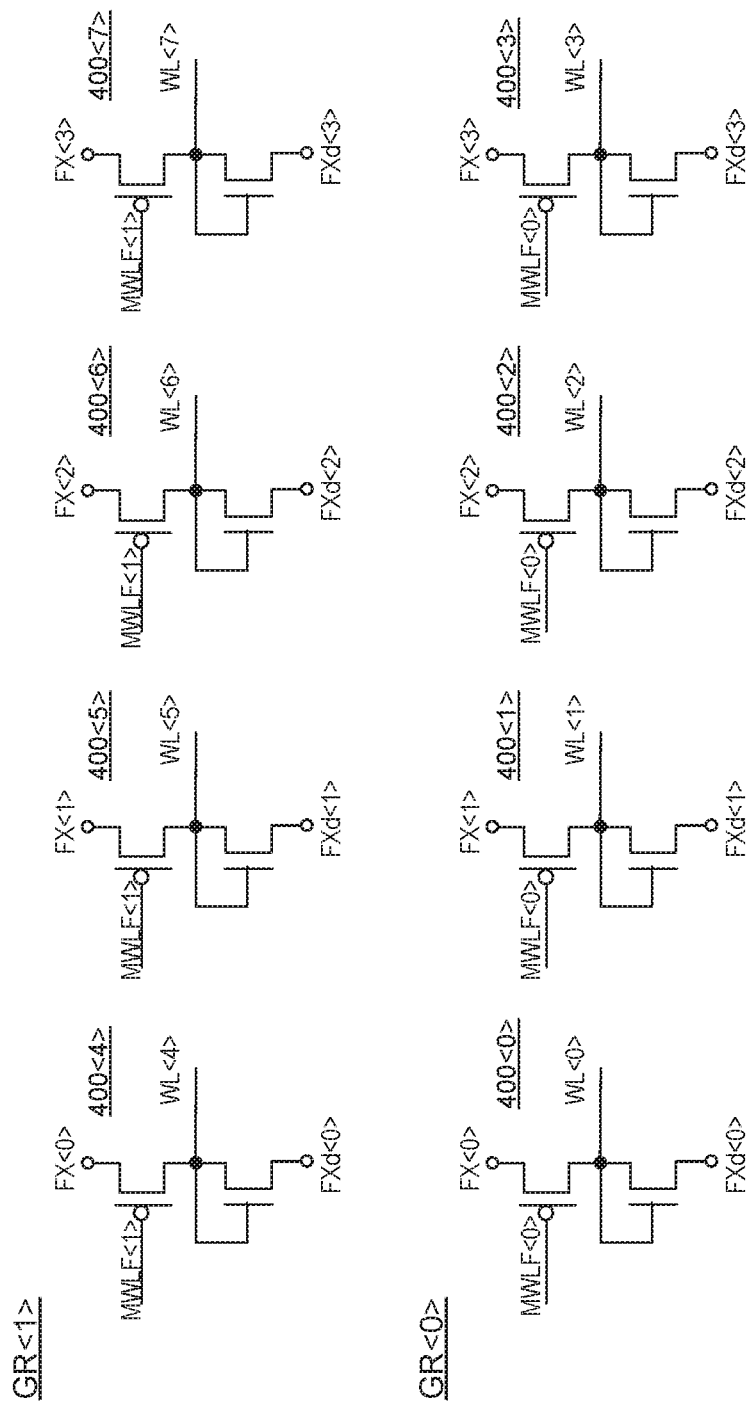
FIG. 6 is a schematic of an embodiment of an array of the sub-word line drivers of FIG. 3A in accordance with the present disclosure.

As discussed above, each of the global word lines GR<k> with corresponding signal MWLF<k> connects to SWDs 400<j> and/or SWDs 420<j> in order to quickly drive the signal levels on the respective local word lines. FIG. 6 illustrates an exemplary embodiment of a SWD 400 array arrangement corresponding to global word lines GR<0> and GR<1>. For clarity, only four SWDs 400 are shown for each global word line GR. For example, in FIG. 6, SWDs 400<0> to <3> are connected to global word line GR<0> with corresponding signal MWLF<0>, and SWDs 400<4> to <7> are connected to global word line GR<1> with corresponding signal MWLF<1>. However, more than four SWDs can be connected to each global word line GR such as, for example eight SWDs, sixteen SWDs or more. Each of the SWDs 400<0> to <7> output a local word line WR<0> to <7>, respectively. Tables 1 and 2, given below, provide the voltages for the SWD 400 array arrangements shown in FIG. 6 for WL driver circuits 200 and 220, respectively. Specifically, Tables 1 and 2 provide the voltages at the input connection for the main word line signal MWLF, the input connections for phase signals FX and FXd, and the output connection for the local word line WL for each SWD 400<0> to <7> for a case where the local word line WL<0> is set to an active state.

TABLE 1

| SWD | MWLF | FX | FXd | WL |
| --- | --- | --- | --- | --- |
| 400<6> | 3.2 | 0 | −0.8 | −0.2 |
| 400<7> | 3.2 | 0 | −0.8 | −0.2 |
| 400<4> | 3.2 | 3.2 | [3.2 − Vthd] | [−0.2] |
| 400<5> | 3.2 | 0 | −0.8 | −0.2 |
| 400<0> | 0 | 3.2 | [3.2 − Vthd] | 3.2 |
| 400<1> | 0 | 0 | −0.8 | −0.2 |
| 400<2> | 0 | 0 | −0.8 | −0.2 |
| 400<3> | 0 | 0 | −0.8 | −0.2 |

TABLE 1-continued

| SWD | MWLF | FX | FXd | WL |
|-----|------|-----|-----|-----|

TABLE 2

| SWD | MWLF | FX | FXd | WL |
|-----|------|-----|-----|-----|
| 400<6> | 3.2 | [−0.2 + Vthu] | −0.8 | −0.2 |
| 400<7> | 3.2 | [−0.2 + Vthu] | −0.8 | −0.2 |
| 400<4> | 3.2 | 3.2 | [3.2 − Vthd] | [−0.2] |
| 400<5> | 3.2 | [−0.2 + Vthu] | −0.8 | −0.2 |
| 400<0> | 0 | 3.2 | [3.2 − Vthd] | 3.2 |
| 400<1> | 0 | [−0.2 + Vthu] | −0.8 | −0.2 |
| 400<2> | 0 | [−0.2 + Vthu] | −0.8 | −0.2 |
| 400<3> | 0 | [−0.2 + Vthu] | −0.8 | −0.2 |

With reference to Table 1 and FIGS. 3A and 6, when MWLF<0> is at a low voltage level and the phase signal FX<0> is at a high voltage level, SWD 400<0> sets the output on local word line WL<0> to an active state (e.g., to voltage Vact, which can be 3.2 volts as shown in Table 1). The local word lines WL<1> to <7> of the remaining SWDs 400<1> to <7> are set at the off state (e.g., to voltage Voff, which can be −0.2 volt). As discussed above, when a SWD 400 is in the active state, the corresponding FXd phase signal has a floating because the FXd phase signal is not tied to a voltage source. As seen in Table 1, the voltage of FXd<0> of SWD 400<0> is shown with brackets to indicate that the voltage on FXd<0> is a floating voltage. The float voltage can go as high as 3.2−Vthd, with Vthd being the threshold voltage of the pull-down transistor 404. Because the FXd<0> signal is also connected to SWD 400<4> (see FIG. 6), the voltage on the FXd connection of SWD 400<4> is also floating. Since the FXd connection on SWD 400<4> is no longer connected to a low voltage source, the voltage on local word line WL<4>, although mostly around −0.2 volt, is also floating and subject to induced voltage swings from adjacent word lines WL. In contrast, the voltages of the remaining non-active state local word lines WL are stable at −0.2 volt because their respective FXd connections are connected to a low voltage source (e.g., Vturn-off).

With reference to Table 2 and FIGS. 4A and 6, as discussed above, when MWLF<0> is at a low voltage level and the phase signal FX<0> is at a high voltage level, SWD 400<0> sets the output on local word line WL<0> to an active state with voltage Vact (e.g., 3.2 volts as shown in Table 2). The local word lines WL of the remaining SWD 400s are at the pre-charge state with a low voltage level of, for example, −0.2 volt. As discussed above, when a SWD 400 is in the active state, the corresponding FXd signal voltage is floating because the FXd signal is not tied to a voltage source. As seen in Table 2, the voltage of FXd<0> of SWD 400<0> is shown with brackets to indicate that the voltage on FXd<0> is a floating voltage. The float voltage can go as high as 3.2−Vthd, with Vthd being the threshold voltage of the pull-down transistor 404. Because the FXd<0> signal is also connected to SWD 400<4>, the voltage on the FXd connection of SWD 400<4> is also floating. Since the FXd connection on SWD 400<4> is no longer connected to a low voltage source, the voltage on local word line WL<4>, although mostly at −0.2 volt, is also floating and subject to induced voltage swings from adjacent word lines WL. In contrast, the voltages of the remaining non-active state local word lines WL are stable at −0.2 volt because their respective FXd connections are connected to a low voltage source that is at −0.8 volt.

As seen in Table 2, the FX<0> phase signal connection for SWD 400<0> is stable and at a high voltage level (e.g., 3.2 volts) because, as discussed above, when an SWD 400 is in the active state, the corresponding FX connection is connected to a high voltage source (e.g., Vccp as seen in FIG. 4A). Accordingly, because the FX<0> phase signal is also connected to SWD<4>, the FX connection for SWD<4> is also stable at 3.2 volts. However, as discussed above, in the WL driver circuit 220 (see FIG. 4A), the FX phase signals are not connected to a low voltage source if no corresponding SWD 400 is driving its local word line WL to an active state. Thus, for the case in Table 2, because the FX<1> to <3> phase signals are not tied to a low power source, for SWDs 400<1> to <3> and <5> to <7>, the voltages on the respective FX connections are floating (see brackets). The voltages on the FX connections will float around a value of −0.2 volt+Vthu, where Vthu is the threshold voltage of the pull-up transistor 402. However, because the local word line voltages for SWDs 400<1> to <3> and <5> to <7> are stable at −0.2 volt, the FX connections can withstand some induced voltage swings without adversely impacting the operation of the corresponding SWD 400.

Figure 7:
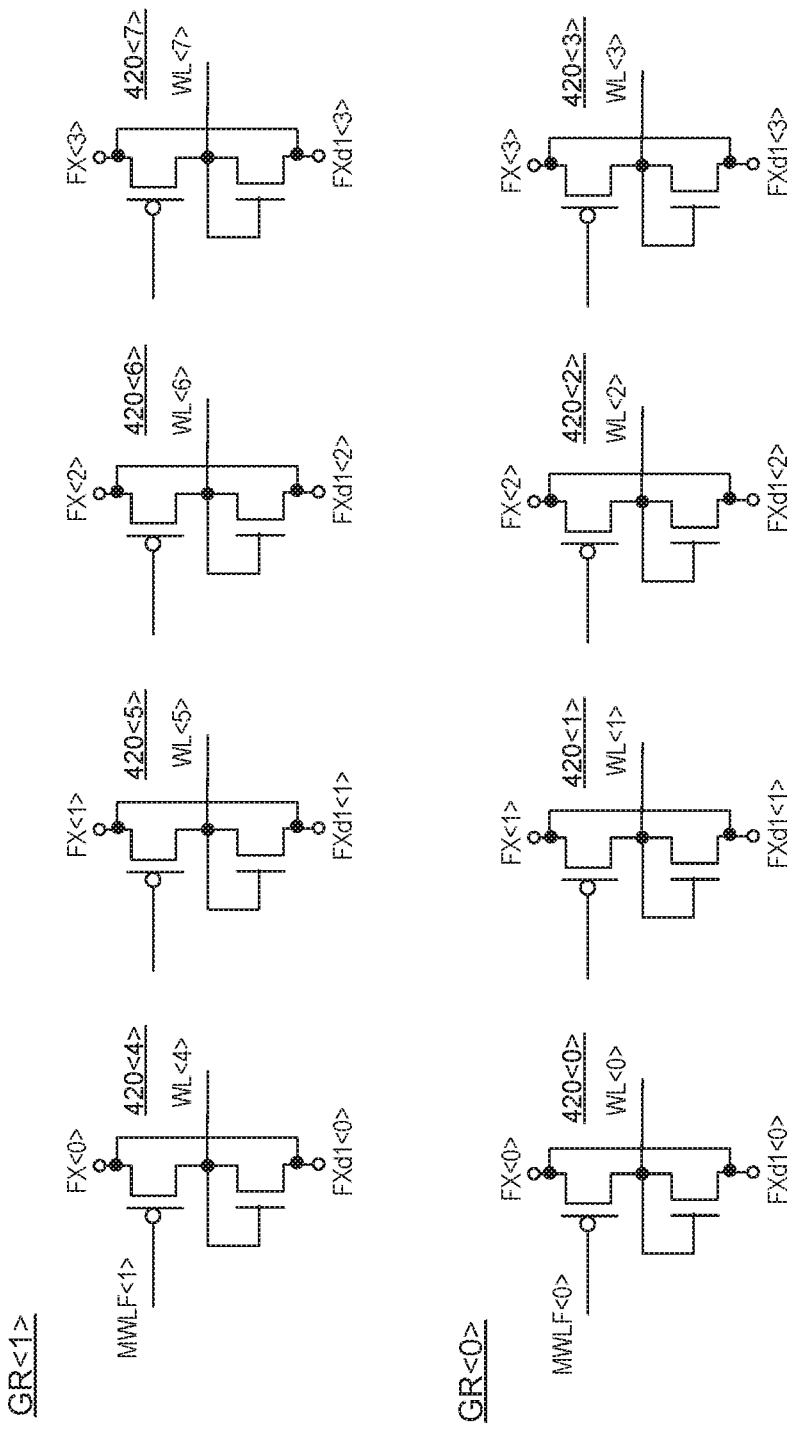
FIG. 7 is a schematic of an embodiment of an array of the sub-word line drivers of FIG. 5A in accordance with the present disclosure.

FIG. 7 illustrates an exemplary embodiment of a SWD 420 array arrangement corresponding to global word lines GR<0> and GR<1>. For clarity, only four sets of SWDs 420 are shown for each global word line GR. For example, in FIG. 7 SWDs 420<0> to <3> are connected to global word line GR<0> with corresponding signal MWLF<0>, and SWDs 420<4> to <7> are connected to global word line GR<1> with corresponding signal MWLF<1>. However, more than four SWDs can be connected to each global word line GR such as, for example eight SWDs, sixteen SWDs or more. Each of the SWDs 420<0> to <7> output a local word line WR<0> to <7>, respectively. Table3, given below, provides the voltages at the input connection for the main word line signal MWLF, the input connection for phase signal FXd1, and the output connection for the local word line WL for each SWD 420<0> to <7>. for a case where the local word line WL<0> is set to an active state

TABLE 3

| SWD | MWLF | FXd1 | WL |
|-----|------|------|-----|
| 420<6> | 3.2 | −0.8 | −0.2 |
| 420<7> | 3.2 | −0.8 | −0.2 |
| 420<4> | 3.2 | 3.2 | [−0.2] |
| 420<5> | 3.2 | −0.8 | −0.2 |
| 420<0> | 0 | 3.2 | 3.2 |
| 420<1> | 0 | −0.8 | −0.2 |
| 420<2> | 0 | −0.8 | −0.2 |
| 420<3> | 0 | −0.8 | −0.2 |

With reference to Table 3 and FIGS. 5A and 7, when MWLF<0> is at a low voltage level and the phase signal FXd1<0> is at a high voltage level, SWD 400<0> sets the output on local word line WL<0> to an active state (e.g., to voltage Vact, which can be 3.2 volts as shown in Table 3). The local word lines WL<1> to <7> of the remaining SWDs 420<1> to <7> are set at the off state (e.g., to voltage Voff, which can be −0.2 volt). As seen in FIG. 7, the FXd1<0> is also connected to SWD 420<4>. Accordingly, with the FXd1<0> signal at 3.2 volts, diode-connected transistor 424 of SWD 420<4> is reversed biased, and with a high voltage on MWLF<1>, transistor 422 is OFF. With both transistors 422 and 424 of SWD 420<4> OFF, SWD 420<4> is no longer connected to a low voltage source. Accordingly, the voltage on local word line WL<4>, although mostly at −0.2 volt, is floating and subject to induced voltage swings from adjacent word lines WL. In contrast, the voltages of the remaining non-active state local word lines WL are stable at −0.2 volt because the respective word line WL are connected to a low voltage source (e.g., Vturn-off) either through transistor 422 (for SWDs 420<1> to <3>) or transistor 424 (for SWDs 420<5> to <7>).

To mitigate issues related to WL-WL voltage induction (or coupling) in the SWDs (e.g., in SWD 400<4> and in SWD 420<4> discussed above with respect to WL driver circuits 200, 220, and 240), exemplary embodiments of the present technology route the local word lines such that word lines WL of SWDs that are connected to a same phase signal (e.g., FXd<i> for WL driver circuits 200 and 220 and/or FXd1<i> for WL driver circuit 240) are not routed next to each other. That is, no two adjacent local word lines are connected to a same phase signal. As seen in FIG. 6, local word line pairs WL<0>/<4>, WL<1>/<5>, WL<2>/<6>, and WL<3>/<7> are configured to have respective common phase signals FXd. Similarly, as seen in FIG. 7, local word line pairs WL<0>/<4>, WL<1>/<5>, WL<2>/<6>, and WL<3>/<7> are configured to have respective common phase signals FXd1. Because WL-WL voltage induction can cause issues in local word lines WL with floating voltages, in some embodiments, the respective local word line pairs WL<0>/<4>, WL<1>/<5>, WL<2>/<6>, and WL<3>/<7> are not disposed adjacent to each other. The listing of the SWDs 400 in the first column of Tables 1 and 2 and the listing of the SWDs 420 in the first column of Table 3 provide an exemplary order for routing the local word line pairs. For example, as seen in each Table, the local word line WL<5> is disposed between local word line pair WL<0>/<4>. Accordingly, even though the voltage on the local word line WL<4> can be floating, the voltage on local word line WL<4> will not be induced to a high voltage level by a high voltage on local word line WL<0> because at least one local word line WL (e.g., WL<5> in the embodiments shown in Tables 1-3) will be disposed between local word line pair WL<0>/<4>. Of course, the orders of the local word lines WL in the respective Table 1-3 are exemplary, and the local word lines can be arranged in orders that are different from those given above so long as word lines connected to a common phase signal (e.g., FXd, FXd1, etc.) are not routed next to each other.

Figure 8:
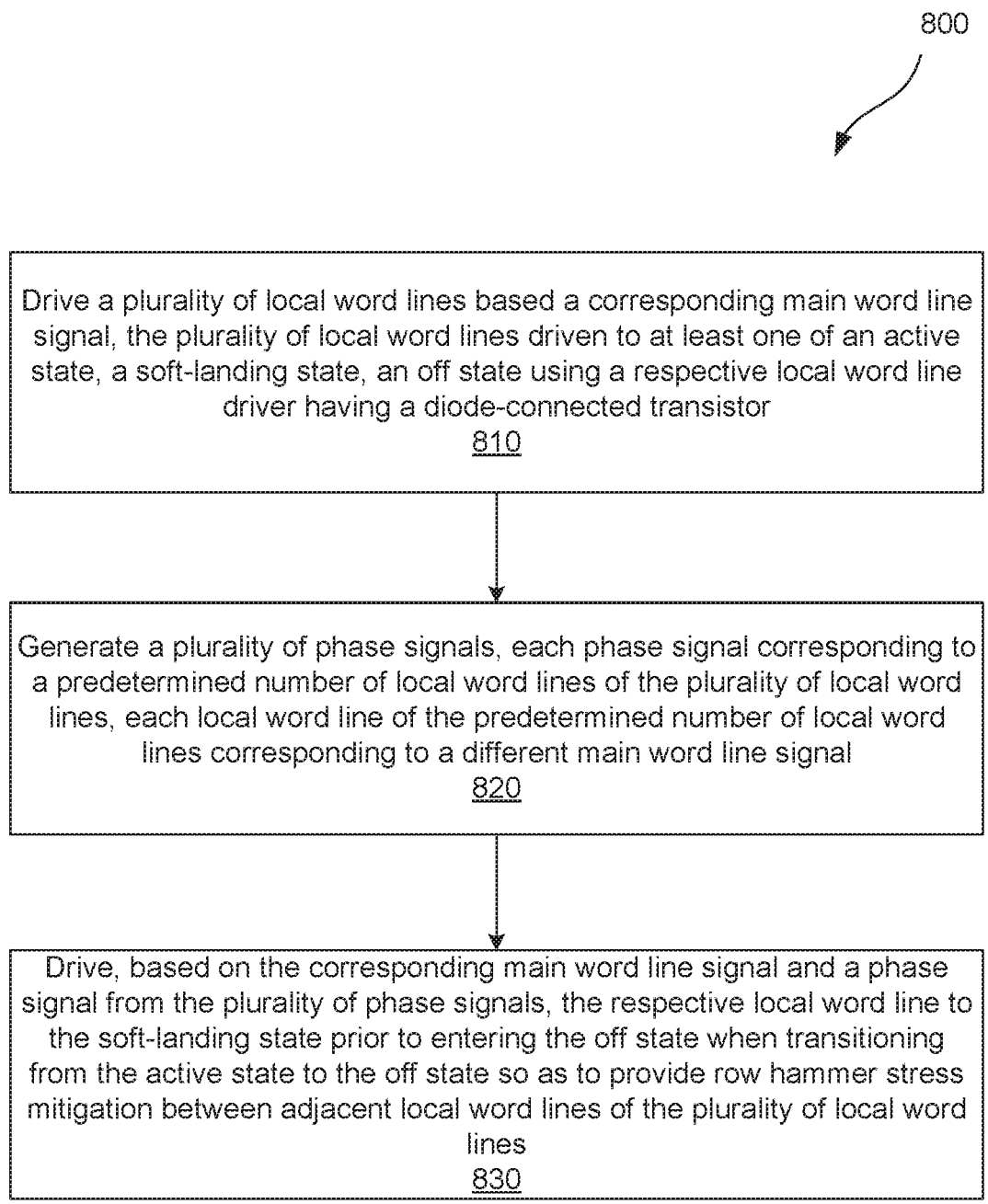
FIG. 8 is flow diagram for managing operation of a sub-word line driver in accordance with the present disclosure.

FIG. 8 is a flow diagram illustrating example method 800 for managing the operation of the SWDs. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the processor 116 and/or another processor or processors that are external and/or internal to memory device 100. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 810, the processing device (e.g., processor 116 and/or another processor) drives a plurality of local word lines based a corresponding main word line signal, the plurality of local word lines driven to at least one of an active state, a soft-landing state, an off state using a respective local word line driver having a diode-connected transistor. In some embodiments, as discussed above, the memory device 100 can include a plurality of SWDs 400 and/or SWDs 420 that are controlled to drive the respective local word lines WL to an active state, a soft-landing state, and/or an off state. As seen in FIGS. 3A to 7, the SWDs 400 and/or SWDs 420 include a diode-connected transistor as, for example, the pull-down transistors of the respective SWD circuits.

At block 820, the processing device (e.g., processor 116 and/or another processor) generates a plurality of phase signals, each phase signal corresponding to a predetermined number of local word lines of the plurality of local word lines, each local word line of the predetermined number of local word lines corresponding to a different main word line signal. For example, as discussed above, the memory device 100 can include a plurality of phase drivers FXDRVs (e.g., FXDRV 500, 550, 560) with each FXDRV including phase driver circuits (e.g., phase driver circuits 510, 520, 530 for FXDRV 500, phase driver circuits 515, 520, 530 for FXDRV 550, and phase driver circuits 570, 580, 590 for FXDRV 560) that generate phase signals FX, FXd and/or FXd1, as appropriate.

At block 830, the processing device (e.g., processor 116 and/or another processor) drives, based on the corresponding main word line signal and a phase signal from the plurality of phase signals, the respective local word line to the soft-landing state prior to entering the off state when transitioning from the active state to the off state so as to provide row hammer stress mitigation between adjacent local word lines of the plurality of local word lines. For example, as seen in FIGS. 3A to 5B, each FXDRV 500/SWD 400 combination, FXDRV 550/SWD 400 combination and/or each FXDRV 560/SWD 420 combination can be controlled such that the respective local word lines WL go to a soft-landing state (e.g., voltage Vland) prior to entering the off state (e.g., voltage Voff) when transitioning from the active state (e.g., voltage Vact) to the off state.

Although the present invention has been described with reference to the disclosed embodiments, persons skilled in the art will recognize that changes may be made in form and detail without departing from the invention. For example, although exemplary embodiments have been explained with respect to NMOS transistors being the only transistors used in the SWD, it will be understood that, in other embodiments, PMOS transistors may be substituted for NMOS embodiments and vice-versa, in which case the memory cells arrays and SWDs may be fabricated in an n-type substrate rather than a p-type substrate. Such modifications are well within the skill of those ordinarily skilled in the art. Accordingly, the invention is not limited except as by the appended claims.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, although steps are presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. For example, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." Additionally, the terms "comprising," "including," "having," and "with" are used throughout to mean including at least the recited feature(s) such that any greater number of the same feature and/or additional types of other features are not precluded.

The processing device (e.g., processor 116 and/or another processor/controller) represents one or more general-purpose processing devices such as a microprocessor, a central processing unit, or the like. More particularly, the processing device can be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device (e.g., controller 190, controller 140 and/or another controller) can also be one or more special-purpose processing devices such as an application specific integrated circuit (ASIC), a field programmable gate array (FPGA), a digital signal processor (DSP), network processor, or the like. The processing device (e.g., controller 190, controller 140 and/or another controller) is configured to execute instructions for performing the operations and steps discussed herein.

The machine-readable storage medium (also known as a computer-readable medium) on which is stored one or more sets of instructions or software embodying any one or more of the methodologies or functions described herein. The machine-readable storage medium can be, for example, memory device 100 or another memory device. The term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can comprise a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

It will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

I claim:

1. An apparatus, comprising:
   a plurality of sub-word line drivers, each sub-word line driver configured to receive a main word line signal on a corresponding global word line and configured to drive a respective local word line to at least one of an active state, a soft-landing state, or an off state based on the respective main word line signal and a respective phase signal;
   a plurality of phase drivers, each phase driver of the plurality of phase drivers configured to generate the respective phase signal, each phase driver connected to a predetermined number of sub-word line drivers of the plurality of sub-word line drivers, where each sub-word line driver of the predetermined number of sub-word line drivers connect to a different global word line; and
   a processing device operatively coupled to each of the sub-word line drivers and each of the phase drivers, the processing device configured to drive the respective local word line to the soft-landing state prior to entering the off state when transitioning from the active state to the off state so as to provide row hammer stress mitigation between adjacent local word lines corresponding to the plurality of sub-word line drivers,
   wherein each sub-word line driver includes a diode-connected transistor.

2. The apparatus of claim 1, wherein each sub-word line driver of the plurality of sub-word line drivers exclusively uses two transistors.

3. The apparatus of claim 2, wherein the two transistors include a PMOS transistor and a NMOS transistor, and the NMOS transistor is the diode-connected transistor.

4. The apparatus of claim 1, wherein the off state is at least one of a pre-charge state or an idle state.

5. The apparatus of claim 1, wherein each of the local word lines are disposed such that no two adjacent local word lines are connected to a same phase driver.

6. The apparatus of claim 1, wherein a voltage level of the respective local word line when in the soft-landing state is in a range of 0.2 volt to 0.4 volt.

7. The apparatus of claim 6, wherein the soft-landing voltage level is adjustable.

8. The apparatus of claim 1, wherein each sub-word line driver of the plurality of sub-word line drivers includes a PMOS transistor to pull up the respective local word line to the active state based on a voltage of the respective phase signal and a voltage of the main word line signal, and a NMOS transistor to pull down the respective local word line to at least one of the soft-landing state or the off state based on the voltage of the respective phase signal and the voltage of the main word line signal.

9. The apparatus of claim 8, wherein each phase driver includes a first phase circuit to set the voltage of the respective phase signal at a voltage level corresponding to the active state based on a first timing signal, a second phase circuit to set the voltage of the respective phase signal at a voltage level corresponding to the soft-landing state based on a second timing signal, and a third phase circuit to set the voltage of the respective phase signal at a voltage level corresponding to the off state based on a third timing signal, and
   wherein the voltage level corresponding to the soft-landing state is below the voltage level corresponding to the active state and above the voltage level corresponding to the off state.

10. The apparatus of claim 8, wherein each phase driver is configured to generate a respective second phase signal,
    wherein each phase driver includes a first phase circuit to set the voltage of the respective phase signal at a voltage level corresponding to the active state based on a first timing signal, a second phase circuit to set a voltage of the respective second phase signal at a voltage level corresponding to the soft-landing state based on a second timing signal, and a third phase circuit to set the voltage of the respective second phase signal at a voltage level corresponding to the off state based on a third timing signal, and
    wherein the voltage level corresponding to the soft-landing state is below the voltage level corresponding to the active state and above the voltage level corresponding to the off state.

11. The apparatus of claim 10, wherein the first phase circuit sets the voltage of the phase signal at the voltage level corresponding to the active state when the first timing signal is at a first state and sets the voltage of the phase signal at a voltage level corresponding to a low voltage level when the first timing signal is at a second state.

12. The apparatus of claim 1, wherein the predetermined number of sub-word line drivers is seven.

13. A method, comprising:
    driving a plurality of local word lines based on a corresponding main word line signal, the plurality of local word lines driven to at least one of an active state, a soft-landing state, or an off state using a respective local word line driver having a diode-connected transistor;
    generating a plurality of phase signals, each phase signal corresponding to a predetermined number of local word lines of the plurality of local word lines, each local word line of the predetermined number of local word lines corresponding to a different main word line signal;
    driving, based on the corresponding main word line signal and a phase signal from the plurality of phase signals, the respective local word line to the soft-landing state prior to entering the off state when transitioning from the active state to the off state so as to provide row hammer stress mitigation between adjacent local word lines of the plurality of local word lines.

14. The method of claim 13, wherein the respective local word line driver exclusively uses two transistors.

15. The method of claim 14, wherein the two transistors include a PMOS transistor and a NMOS transistor, and the NMOS transistor is the diode-connected transistor.

16. The method of claim 13, wherein the off state is one of a pre-charge state or an idle state.

17. The method of claim 13, wherein each of the local word lines are disposed such that no two adjacent local word lines receive a same phase signal.

18. The method of claim 13, wherein a voltage level of the respective local word line when in the soft-landing state is in a range of 0.2 volt to 0.4 volt.

19. The method of claim 18, wherein the soft-landing voltage level is adjustable.

20. The method of claim 13, wherein the driving of the plurality of local word lines includes pulling up the respective local word line to the active state based on a voltage of the respective phase signal and a voltage of the corresponding main word line signal, and pulling down the respective local word line to at least one of the soft-landing state or the off state based on the voltage of the respective phase signal and the voltage of the corresponding main word line signal.

21. The method of claim 20, further comprising:
setting the voltage of the respective phase signal at a voltage level corresponding to the active state based on a first timing signal;
setting the voltage of the respective phase signal at a voltage level corresponding to the soft-landing state based on a second timing signal; and
setting the voltage of the respective phase signal at a voltage level corresponding to the off state based on a third timing signal,
wherein the voltage level corresponding to the soft-landing state is below the voltage level corresponding to the active state and above the voltage level corresponding to the off state.

22. The method of claim 20, further comprising:
generating a plurality of second phase signals, each second phase signal corresponding to the predetermined number of local word lines of the plurality of local word lines;
setting the voltage of the respective phase signal at a voltage level corresponding to the active state based on a first timing signal;
setting the voltage of the respective second phase signal at a voltage level corresponding to the soft-landing state based on a second timing signal;
setting the voltage of the respective second phase signal at a voltage level corresponding to the off state based on a third timing signal,
wherein the voltage level corresponding to the soft-landing state is below the voltage level corresponding to the active state and above the voltage level corresponding to the off state.

23. The method of claim 22, wherein the setting of the voltage of the respective phase signal includes:
setting the voltage of the respective phase signal at the voltage level corresponding to the active state when the first timing signal is at a first state,
setting the voltage of the respective phase signal at the voltage level corresponding to a low voltage level when the first timing signal is at a second state.

24. The method of claim 13, wherein the predetermined number of local word lines is seven.

* * * * *